US012700453B2

(12) United States Patent
Tanaka

(10) Patent No.: US 12,700,453 B2
(45) Date of Patent: Aug. 4, 2026

(54) MEMORY AND METHOD RELATED TO TRACKING MEMORY

(71) Applicant: Taiwan Semiconductor Manufacturing Company, Ltd., Hsinchu (TW)

(72) Inventor: Tomotaka Tanaka, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 217 days.

(21) Appl. No.: 18/764,047

(22) Filed: Jul. 3, 2024

(65) Prior Publication Data
US 2026/0011363 A1    Jan. 8, 2026

(51) Int. Cl.
G11C 11/417 (2006.01)
G11C 11/4076 (2006.01)
G11C 11/412 (2006.01)

(52) U.S. Cl.
CPC ........ G11C 11/417 (2013.01); G11C 11/4076 (2013.01); G11C 11/412 (2013.01)

(58) Field of Classification Search
CPC . G11C 11/417; G11C 11/4076; G11C 11/412; G11C 11/418; G11C 11/419
See application file for complete search history.

(56) References Cited

U.S. PATENT DOCUMENTS

| | | | | |
|---|---|---|---|---|
| 2010/0246309 A1* | 9/2010 | Shimono | .................. | G11C 8/08 |
| | | | | 365/230.06 |
| 2012/0195109 A1* | 8/2012 | Noro | ...................... | G11C 7/227 |
| | | | | 365/189.15 |
| 2017/0148508 A1* | 5/2017 | Aggarwal | ............. | G11C 11/412 |
| 2023/0064595 A1* | 3/2023 | Huang | ............. | H03K 19/01742 |
| 2024/0079050 A1* | 3/2024 | Chen | ...................... | G11C 11/419 |

* cited by examiner

*Primary Examiner* — Jay W. Radke
(74) *Attorney, Agent, or Firm* — JCIPRNET

(57) ABSTRACT
A memory and a method related to tracking a memory are provided. The memory includes a memory cell array, a tracking cell column, a first tracking word line, and a second tracking word line. The tracking cell column is coupled to the memory cell array. The tracking cell column includes a first tracking cell and a second tracking cell. The first and second tracking cells are configured to track operations of two rows of memory cells of the memory cell array, respectively. The first tracking word line is coupled to the first tracking cell. The second tracking word line is coupled to the second tracking.

20 Claims, 19 Drawing Sheets

1-2

161

17₀

| Cycle | CT | TRKWL/TRKBL |
|-------|-----|-------------------|
| ... | ... | ... |
| 1 | 0 | TRKWL[0]/TRKBL[0] |
| 2 | 1 | TRKWL[1]/TRKBL[1] |
| 3 | 0 | TRKWL[0]/TRKBL[0] |
| 4 | 1 | TRKWL[1]/TRKBL[1] |
| 5 | 0 | TRKWL[0]/TRKBL[0] |
| ... | ... | ... |

| Cycle | CT | TRKWL/TRKBL |
|---|---|---|
| ... | ... | ... |
| 1 | 0 | TRKWL[1]/TRKBL[0] |
| 2 | 1 | TRKWL[0]/TRKBL[1] |
| 3 | 0 | TRKWL[1]/TRKBL[0] |
| 4 | 1 | TRKWL[0]/TRKBL[1] |
| 5 | 0 | TRKWL[1]/TRKBL[0] |
| ... | ... | ... |

| $CT_p$ | $\cdots$ | $CT_1$ | $CT_0$ | $D_p$ | $\cdots$ | $D_1$ | $D_0$ |
|---|---|---|---|---|---|---|---|
| 0 | $\cdots$ | 0 | 0 | 0 | $\cdots$ | 0 | 1 |
| 0 | $\cdots$ | 0 | 1 | 0 | $\cdots$ | 1 | 1 |
| $\vdots$ | | | | $\vdots$ | | | |
| 1 | $\cdots$ | 1 | 0 | 1 | $\cdots$ | 1 | 1 |
| 1 | $\cdots$ | 1 | 1 | 0 | $\cdots$ | 0 | 0 |

FIG. 19

| Cycle | $CT_p$ | $\cdots$ | $CT_1$ | $CT_0$ | TRKWL/TRKBL |
|---|---|---|---|---|---|
| 1 | 0 | $\cdots$ | 0 | 0 | TRKWL[0]/TRKBL[0] |
| 2 | 0 | $\cdots$ | 0 | 1 | TRKWL[1]/TRKBL[1] |
| $\vdots$ | | $\vdots$ | | | $\vdots$ |
| n | 1 | $\cdots$ | 1 | 0 | TRKWL[n−1]/TRKBL[n−1] |
| n+1 | 0 | $\cdots$ | 1 | 1 | TRKWL[0]/TRKBL[0] |

FIG. 20

| $CT_1$ | $CT_0$ | $D_1$ | $D_0$ |
|--------|--------|-------|-------|
| 0 | 0 | 0 | 1 |
| 0 | 1 | 1 | 0 |
| 1 | 0 | 1 | 1 |
| 1 | 1 | 0 | 0 |

FIG. 23

| Cycle | $CT_1$ | $CT_0$ | TRKWL/TRKBL |
|-------|--------|--------|-------------|
| 1 | 0 | 0 | TRKWL[0]/TRKBL[0] |
| 2 | 0 | 1 | TRKWL[1]/TRKBL[1] |
| 3 | 1 | 0 | TRKWL[2]/TRKBL[2] |
| 4 | 1 | 1 | TRKWL[3]/TRKBL[3] |

FIG. 24

MEMORY AND METHOD RELATED TO TRACKING MEMORY

BACKGROUND

In a tracking operation of a memory, multiple cells of the memory are tracked. A tracked signal may be toggled every cycle of the tracking period. It should be noted that the voltage level of the tracked signal may swing the full range (for example, swing from the lowest level to the highest level or swing from the highest level to the lowest level), and result in a relatively high current flow. However, if the tracking line wiring becomes thinner and the current density increases, electro-migration (EM) may occur. Furthermore, EM can lead to wire breakage, possibly resulting in the inability of the memory to function properly.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 19 is a table illustrating the correspondence between control signals and data signals according to one of the exemplary embodiments of the disclosure.

FIG. 20 is a table illustrating the correspondence between cycle, control signal, and tracking word line/tracking bit line according to one of the exemplary embodiments of the disclosure.

FIG. 23 is a table illustrating the correspondence between control signals and data signals according to one of the exemplary embodiments of the disclosure.

FIG. 24 is a table illustrating the correspondence between cycle, control signal, and tracking word line/tracking bit line according to one of the exemplary embodiments of the disclosure.

DESCRIPTION OF THE EMBODIMENTS

Figure 1:
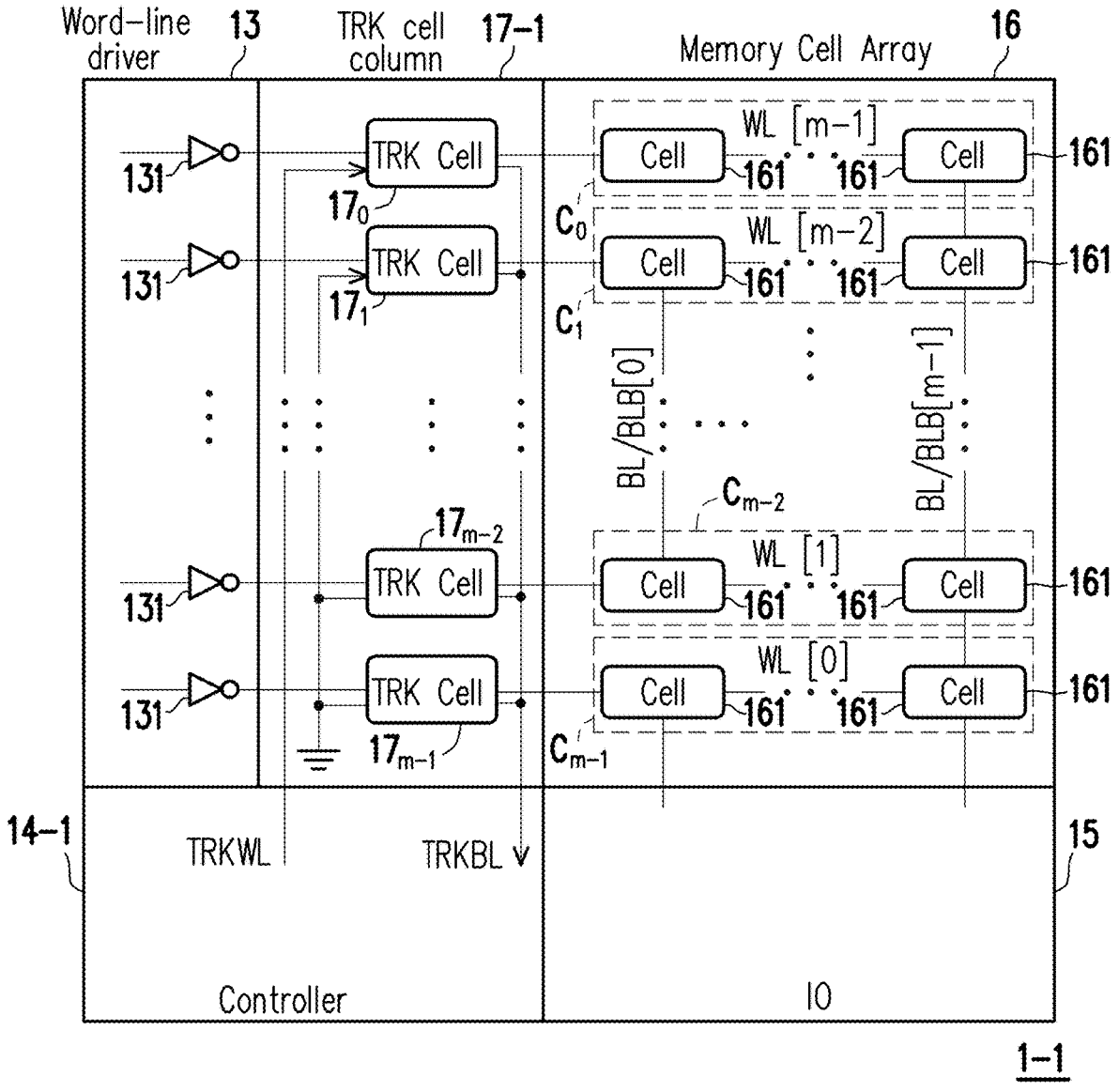
FIG. 1 is a schematic diagram illustrating a memory according to one of the exemplary embodiments of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram illustrating a memory 1-1 according to one of the exemplary embodiments of the disclosure. Referring to FIG. 1, the memory 1-1 includes (but is not limited to) a master tracking word line TRKWL, a master tracking bit line TRKBL, a word-line driver 13, a controller 14-1, an input/output (IO) circuit 15, a memory cell array 16, and a tracking cell column 17-1.

The memory 1-1 could be static random-access memory (SRAM), dynamic random-access memory (DRAM), or other types of memory.

The master tracking word line TRKWL is configured to transmit a tracking word line signal which will be introduced later.

The master tracking bit line TRKBL is configured to transmit a tracking bit line signal which will be introduced later.

The word-line driver 13 includes (but is not limited to) one or more inverters 131. Each inverter 131 is configured to output a corresponding word line signal (for example, word line signal transmitted on the word line WL [1] to the word line WL [m−1], where m is a positive integer larger than 1) on word line bus (not shown) where each word line signal is corresponding to a row of memory cells 161 in the memory cell array 16.

The controller 14-1 is coupled to the tracking cell column 17-1 through the master tracking word line TRKWL and the master tracking bit line TRKBL. In one embodiment, the controller 14-1 is configured to transmit control signals which will be introduced later.

The IO circuit 15 is configured to perform read, write, or other operations on the memory cell array 16.

The memory cell array 16 includes multiple memory cells 161. In one embodiment, the memory cells 161 include static random-access memory (SRAM) cells. In some embodiments, the memory cells 161 include dynamic random-access memory (DRAM) cells or other memory cell types configured for storing bit data.

In one embodiment, the memory cell array 16 includes multiple rows of memory cells 161. For example, the row $C_0$ to the row $C_{m-1}$, where m is a positive integer larger than 2. The row $C_0$ of memory cells 161 corresponds to word line WL [m−1], the row $C_1$ of memory cells 161 corresponds to word line WL[m−2], the row $C_{m-2}$ of memory cells 161 corresponds to word line WL [1], the row $C_{m-1}$ of memory cells 161 corresponds to word line WL [0], and so forth. Each word line is used to transmit the word line signal from the word-line driver 13.

In one embodiment, the memory cell array 16 includes multiple columns of memory cells 161. Each column of memory cells 161 corresponds to one bit line (such as one of the bit line BL/BLB[0] to the bit line BL/BLB[m−1]). Each bit line is used to transmit a bit line signal.

Figure 2:
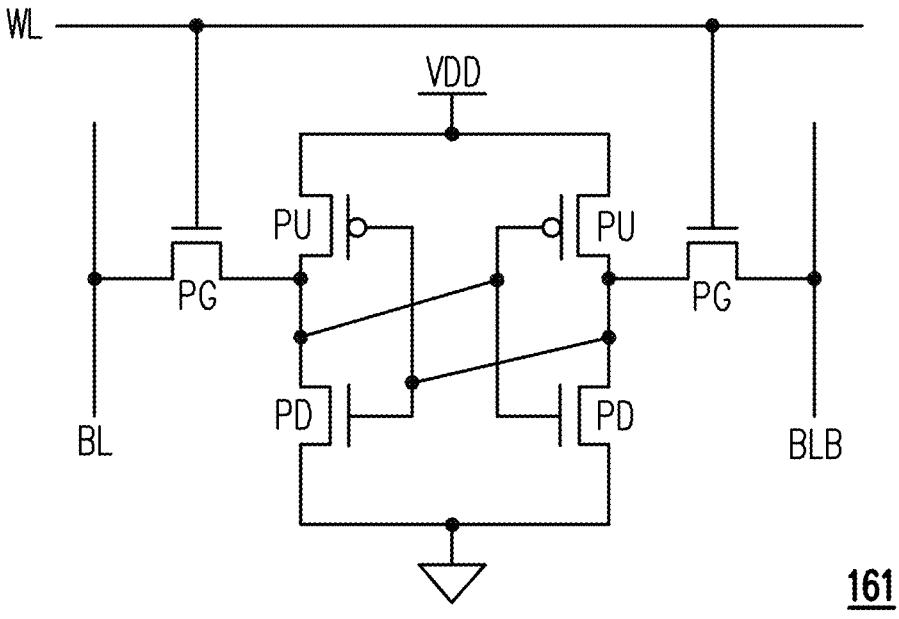
FIG. 2 is a schematic diagram illustrating a memory cell according to one of the exemplary embodiments of the disclosure.

FIG. 2 is a schematic diagram illustrating a memory cell 161 according to one of the exemplary embodiments of the disclosure. Referring to FIG. 2, taking the SRAM cell as an example, the memory cell 161 includes pass-gate (PG) transistors PG, (PD) transistors PD, and pull-up (PU) transistors PU. The memory cell 161 is configured to be responsive to a word line signal received on the word line bus, and be electrically coupled with one or both of bit lines BL and BLB. For example, the gate of the PG transistor PG is coupled to the word line WL (such as the word line WL [0] to the word line WL [m−1] as shown in FIG. 1). The source of the PG transistor PG is coupled to the bit line BL or BLB (such as one of the bit lines BL/BLB [0] to one of the bit lines BL/BLB [m−1] as shown in FIG. 1). The PU transistor PU is coupled to the supply voltage VDD and to one or more data nodes. The PD transistor PD is coupled to the ground. One or both of the bit lines BL or BLB may be charged or discharged in a read operation according to the logical state stored in the memory cell 161. When memory cell 161 is written to, complementary write data signals are placed on the bit lines BL and BLB. A positive control signal on the word line WL is coupled to the gate of two PG transistors PG, the write data on the bit lines BL and BLB may overwrite the stored data at data nodes, and thus write the memory cell 161 to a desired state.

Referring to FIG. 1, the tracking cell column 17-1 comprises multiple tracking (TRK) cells. For example, TRK cells $17_0$ to $17_{m-1}$. Each TRK cell corresponds to one word line. For example, TRK cell $17_0$ corresponds to the word line WL [m−1], TRK cell $17_1$ corresponds to the word line WL [m−2], and so forth. One or more TRK cells are coupled to the master tracking word line TRKWL. For example, TRK cell $17_0$ is coupled to the master tracking word line TRKWL, and TRK cell $17_1$ to TRK cell $17_{m-1}$ are not coupled to the master tracking word line TRKWL (for example, be grounded). One or more TRK cells are coupled to the master tracking bit line TRKBL. For example, TRK cell $17_0$ to TRK cell $17_{m-1}$ are coupled to the master tracking bit line TRKBL.

Figure 3:
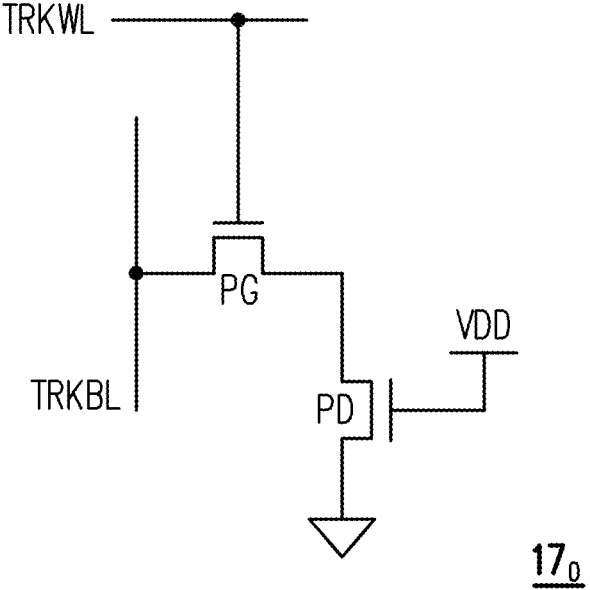
FIG. 3 is a schematic diagram illustrating a tracking cell according to one of the exemplary embodiments of the disclosure.

FIG. 3 is a schematic diagram illustrating a tracking cell $17_0$ according to one of the exemplary embodiments of the disclosure. Referring to FIG. 3, taking the TRK cell $17_0$ as an example in which the TRK cells $17_1$ to $17m_{-1}$ may have the same circuit, the TRK cell $17_0$ includes PG transistor PG and PD transistor PD. The gate of the PG transistor PG is coupled to the master tracking word line TRKWL, and the source of the PG transistor PG is coupled to the master tracking bit line TRKBL. The gate of the PD transistor PD is coupled to the supply voltage VDD.

Figure 4:
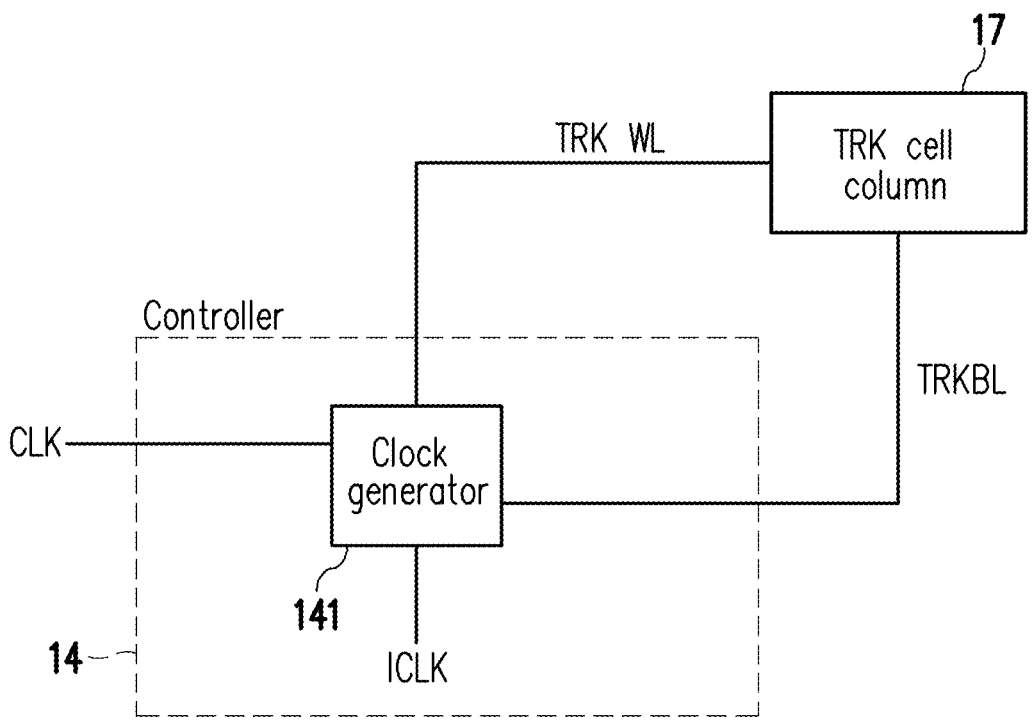
FIG. 4 is a schematic diagram illustrating a controller and a tracking cell column according to one of the exemplary embodiments of the disclosure.

FIG. 4 is a schematic diagram illustrating a controller 14-1 and a tracking cell column 17 according to one of the exemplary embodiments of the disclosure. Referring to FIG. 4, the controller 14-1 includes a clock generator 141. The clock generator 141 is coupled to the master tracking word line TRKWL and the master tracking bit line TRKBL. The clock generator 141 is configured to receive a clock signal CLK. The clock generator 141 may generate an inter-clock signal ICLK based on the clock signal CLK. The inter-clock signal ICLK is used to generate the tracking word line signal transmitted on the master tracking word line TRKWL.

Referring to FIG. 1, the TRK cell $17_0$ is configured to track an operation of the row $C_0$ of memory cells 161 of the memory cell array 16, the TRK cell $17_1$ is configured to track an operation of the row $C_1$ of memory cells 161 of the memory cell array 16 when connected to TRKWL, the TRK cell $17_{m-2}$ is configured to track an operation of the row $C_{m-2}$ of memory cells 161 of the memory cell array 16 when connected to TRKWL, the TRK cell $17_{m-1}$ is configured to track an operation of the row $C_{m-1}$ of memory cells 161 of the memory cell array 16 when connected to TRKWL, and so forth. The operation may be the write, read, or another type of operation.

Figure 5:
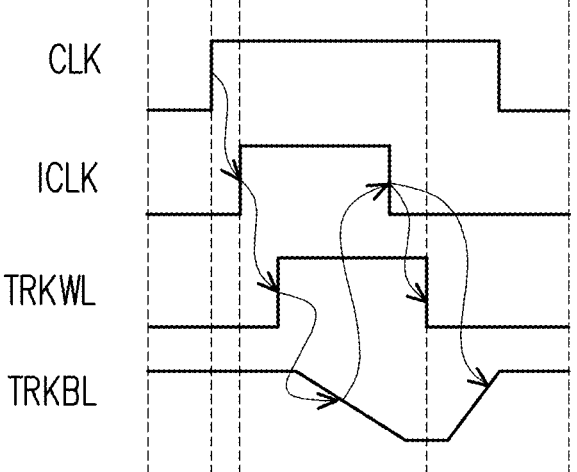
FIG. 5 is a timing chart of a tracking operation of the tracking cell according to one of the exemplary embodiments of the disclosure.

FIG. 5 is a timing chart of a tracking operation of the tracking cell 17$_0$ according to one of the exemplary embodiments of the disclosure. Referring to FIG. 5, taking the TRK cell 17$_0$ as an example in which the TRK cells 17$_1$ to 17$m_{-1}$ may have the same operation, the inter-clock signal ICLK, which is generated based on the clock signal CLK, is asserted, and the master tracking word line TRKWL or the tracking word line signal is asserted in response to the asserting of the inter-clock signal ICLK. The master tracking bit line TRKBL that is connected to the TRK cell 17$_0$ is pre-charged high before operation. When the master tracking word line TRKWL or the tracking word line signal is asserted, the PG transistor PG of the TRK cell 17$_0$, which is connected to the master tracking word line TRKWL, turns on. In some embodiments, it is possible to have multiple TRK cells that are connected to the master tracking word line TRKWL. At the same time, the current is drawn from the master tracking bit line TRKBL via the PG transistor PG and the PD transistor PD of the TRK cell 17$_0$ to the ground, and then the voltage of the master tracking bit line TRKBL or the tracking bit line signal is dropped. When the voltage of the master tracking bit line TRKBL or the tracking bit line signal reaches a certain value, a reset is activated, and the inter-clock signal ICLK is negated/unasserted. The master tracking word line TRKWL or the tracking word line signal is also negated/unasserted by the inter-clock signal ICLK, and the master tracking bit line TRKBL or the tracking bit line signal is pre-charged high in preparation for the next operation.

By using TRK cells (such as the TRK cells 17$_0$ to 17$_{m-1}$ as shown in FIG. 1), it is possible to mimic the current draw speed of the actual memory cell, allowing for the generation of the inter-clock signal ICLK negation at the timing of the completion of Read/Write of the actual memory cell 161. The master tracking word line TRKWL and/or the master tracking bit line TRKBL may be toggled every cycle of the clock signal CLK or the inter-clock signal ICLK, resulting in a 100% toggle rate. Furthermore, the full range voltage swings (from 0 to the voltage of the supply voltage VDD or from the voltage of the supply voltage VDD to 0), leading to a relatively high current flow. At leading nodes, the word line WL or the bit line BL/BLB wiring becomes thinner, therefore, the master tracking word line TRKWL and the master tracking bit line TRKBL become also thinner to mimic the word line WL and the bit line BL/BLB. If the current density increases, it makes electro-migration (EM) more likely to occur. EM can lead to wire breakage, possibly resulting in the inability of the memory to function properly.

Figure 6:
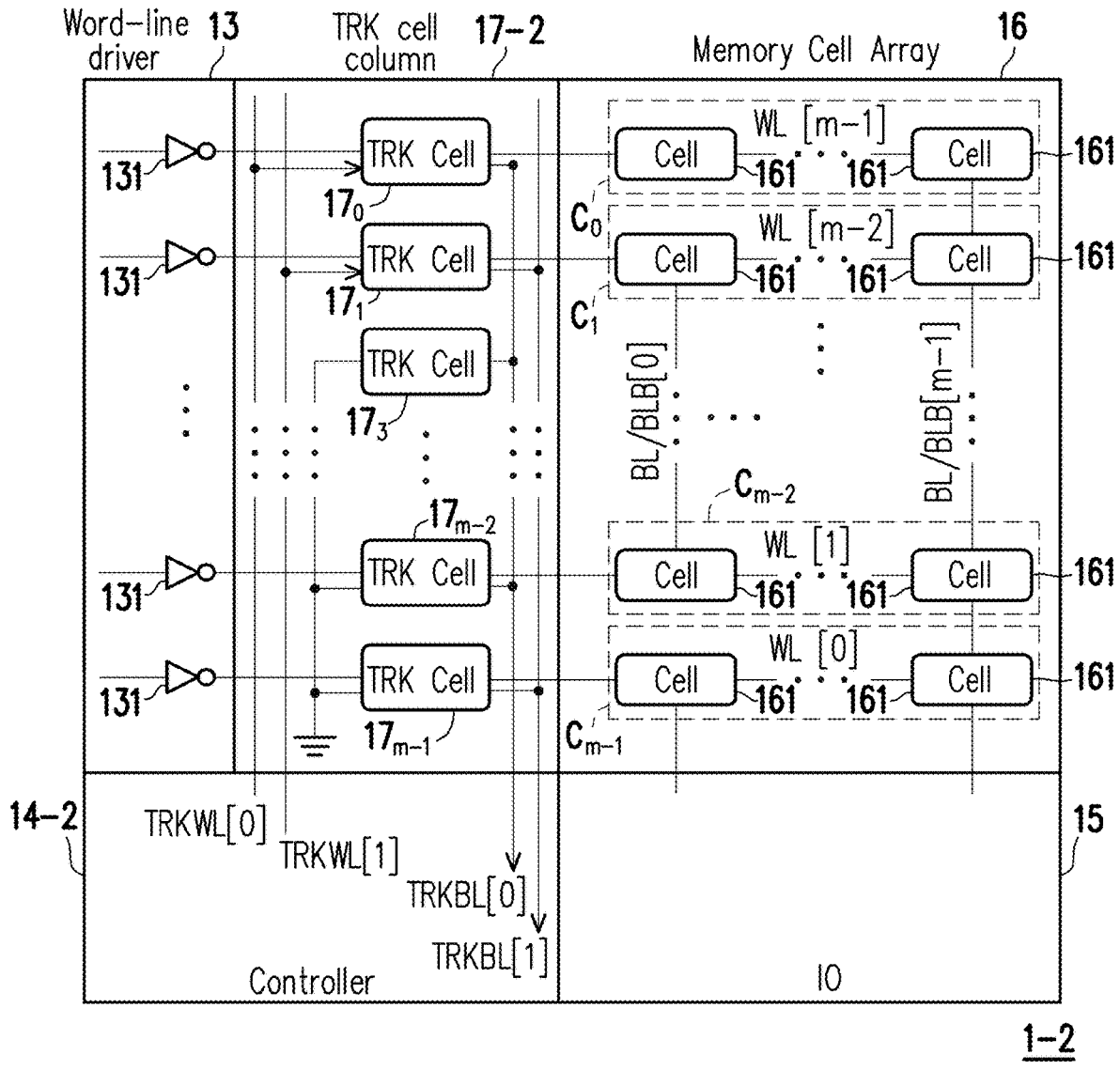
FIG. 6 is a schematic diagram illustrating a memory according to one of the exemplary embodiments of the disclosure.

FIG. 6 is a schematic diagram illustrating a memory 1-2 according to one of the exemplary embodiments of the disclosure. Referring to FIG. 6, the memory 1-2 includes (but is not limited to) tracking word lines TRKWL[0] and TRKWL[1], tracking bit lines TRKBL[0] and TRKBL[1], a word-line driver 13, a controller 14-2, an IO circuit 15, a memory cell array 16, and a tracking cell column 17-2.

Compared with the memory 1-1 as shown in FIG. 1, the differences are that two tracking word lines TRKWL[0] and TRKWL[1] are provided, where the tracking word line TRKWL[0] is coupled to the TRK cell 17$_0$ (for example, wiring of the master tracking word line TRKWL which is connected to the gate of PG transistor PG as shown in FIG. 3), and the tracking word line TRKWL[1] is coupled to the TRK cell 17$_1$. In some embodiments, the tracking word line TRKWL[0] or the tracking word line TRKWL[1] may be further coupled to other TRK cells such as one or more of TRK cell 17$_3$ to the TRK cell 17$_{m-1}$. Furthermore, two tracking bit lines TRKBL[0] and TRKBL[1] are provided, where the tracking bit line TRKBL[0] is coupled to one or more TRK cells (such as the TRK cell 17$_0$, 17$_3$, and 17$_{m-2}$) (for example, wiring of the master tracking bit line TRKBL which is connected to the source of PG transistor PG as shown in FIG. 3), and the tracking bit line TRKBL[1] is coupled to the one or more TRK cells (such as the TRK cell 17$_1$ and 17$_{m-1}$). In some embodiments, the tracking bit line TRKBL[0] or the tracking bit line TRKBL[1] may be further coupled to other TRK cells such as one or more of TRK cell 17$_0$ to the TRK cell 17$_{m-1}$.

It should be noted that the connection of each TRK cell to the tracking word line TRKWL[1]/TRKWL[0] may be varied based on the actual requirement. Corresponding wiring for the tracking bit line TRKBL[1]/TRKBL[0] is provided for the tracking word line TRKWL[1]/TRKWL[0]. Taking FIG. 6 as an example, the master tracking bit line TRKBL of the TRK cell (such as the TRK cell 17$_0$ as shown in FIG. 3) connected to the tracking word line TRKWL[0] is connected to the wiring of the tracking bit line TRKBL[0]. The tracking bit line TRKBL of the TRK cell connected to the tracking word line TRKWL[1] is connected to the wiring of the tracking bit line TRKBL[1]. For unused TRK cells (such as the TRK cell 17$_3$, 17$_{m-2}$, and 17$_{m-1}$) without connection to the tracking word line TRKWL[1]/TRKWL[0], their connected master tracking bit line TRKBL can be connected to either the tracking bit line TRKBL[0] or TRKBL[1]. However, in some embodiments, to ensure that the memory operation timing remains constant cycle by cycle of the clock signal CLK (but is not limited to this purpose), it may have the same or similar number of TRK cells connected to the tracking bit lines TRKBL[0] and TRKBL[1]. Similarly, in some embodiments, it may have an equal number of TRK cells connected to the tracking word line TRKWL[1]/TRKWL[0], but it is not limited thereto.

In one embodiment, a tracking word line signal is transmitted on one of the first tracking word line and the second tracking word line during a first cycle of a clock signal, and the tracking word line signal is transmitted on another one of the first tracking word line and the second tracking word line during a second cycle of the clock signal. For example, the tracking word line signal is transmitted on the tracking word line TRKWL[0] in cycle 1 of the clock signal CLK and transmitted on the tracking word line TRKWL[1] in cycle 2 of the clock signal CLK.

Figure 7:
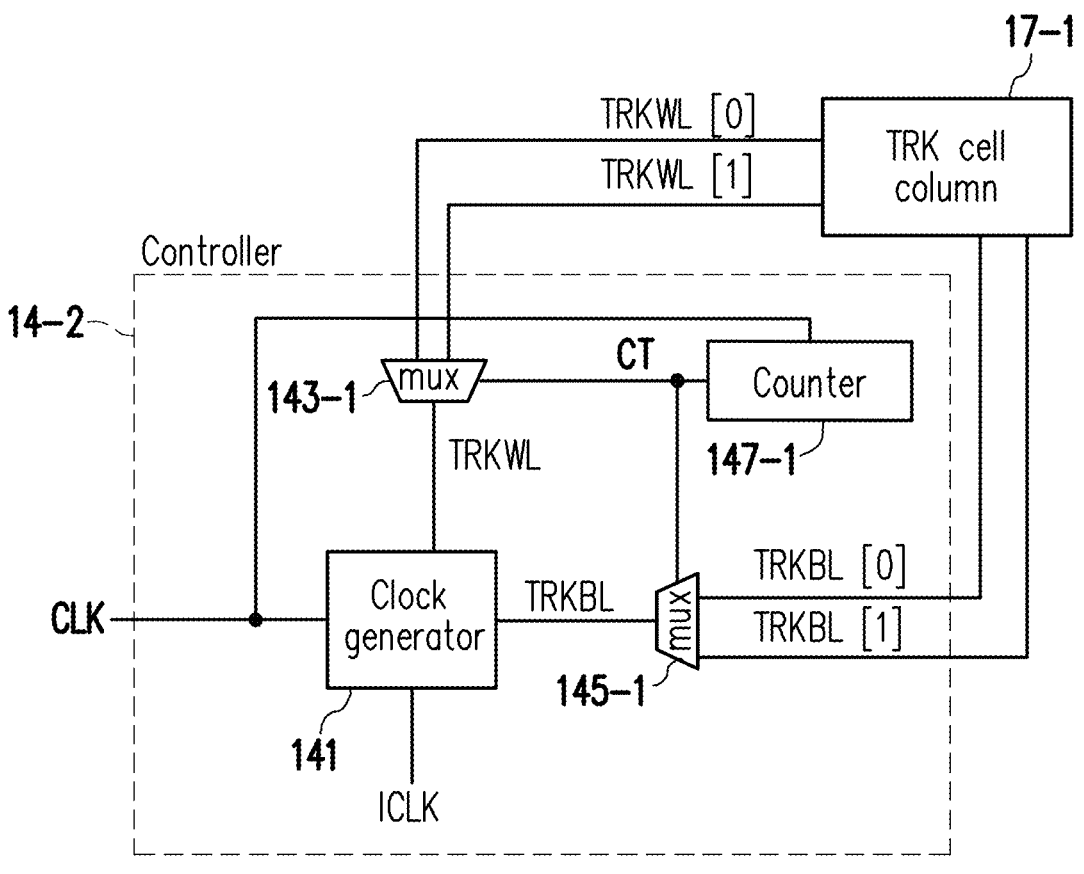
FIG. 7 is a schematic diagram illustrating a controller and a tracking cell column according to one of the exemplary embodiments of the disclosure.

FIG. 7 is a schematic diagram illustrating a controller 14-2 and a tracking cell column 17-2 according to one of the exemplary embodiments of the disclosure. Referring to FIG. 7, compared with the controller 14-1 as shown in FIG. 4, the differences are that the controller 14-2 further includes two multiplexers 143-1 and 145-1 and a counter circuit 147-1. Furthermore, two tracking word lines TRKWL[1] and TRKWL[0] and two tracking bit lines TRKBL[0] and TRKBL[1] are connected to the track cell column 17-1.

The multiplexer or demultiplexer (mux) 143-1 is coupled to the master tracking word line TRKWL, and to the tracking word lines TRKWL[0] and TRKWL[1]. In one embodiment, the multiplexer 143-1 is configured to receive the tracking word line signal from the master tracking word line TRKWL, and select one of the tracking word lines TRKWL[0] and TRKWL[1] to output the tracking word line signal.

The multiplexer (mux) 145-1 is coupled to the master tracking bit line TRKBL, and to the tracking bit lines TRKBL[0] and TRKBL[1]. In one embodiment, the multiplexer 145-1 is configured to select one of the tracking bit lines TRKBL[0] and TRKBL[1] receive the tracking bit line signal, and transmit the tracking bit line signal to the master tracking bit line TRKBL.

The counter circuit 147-1 is coupled to the multiplexer 143-1 and the multiplexer 145-1. In one embodiment, the counter circuit 147-1 is configured to receive the clock signal CLK, and transmit a control signal CT to the multiplexer 143-1 and the multiplexer 145-1, respectively.

Figure 8A:
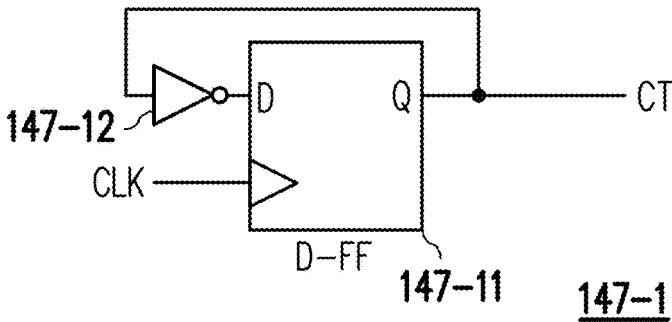
FIG. 8A is a schematic diagram illustrating a counter circuit according to one of the exemplary embodiments of the disclosure.

FIG. 8A is a schematic diagram illustrating a counter circuit 147-1 according to one of the exemplary embodiments of the disclosure. Referring to FIG. 8A, the counter circuit 147-1 is configured as one-bit output, and the counter circuit 147-1 includes a D flip-flop (D-FF) 147-11 known as a data flip-flop and an inverter 147-12. The "D"-input of the D-FF 147-11 is coupled to the output of the inverter 147-12. The input of the inverter 147-12 is the control signal CT which is the "Q"-output of the D-FF 147-11. The clock input of the D-FF 147-11 is configured to receive the clock signal CLK.

The D-FF 147-11 captures the value of the "D"-input at a definite portion of the clock cycle (such as the rising edge of the clock signal CLK), and the captured value becomes the "Q"-output.

Figure 8B:
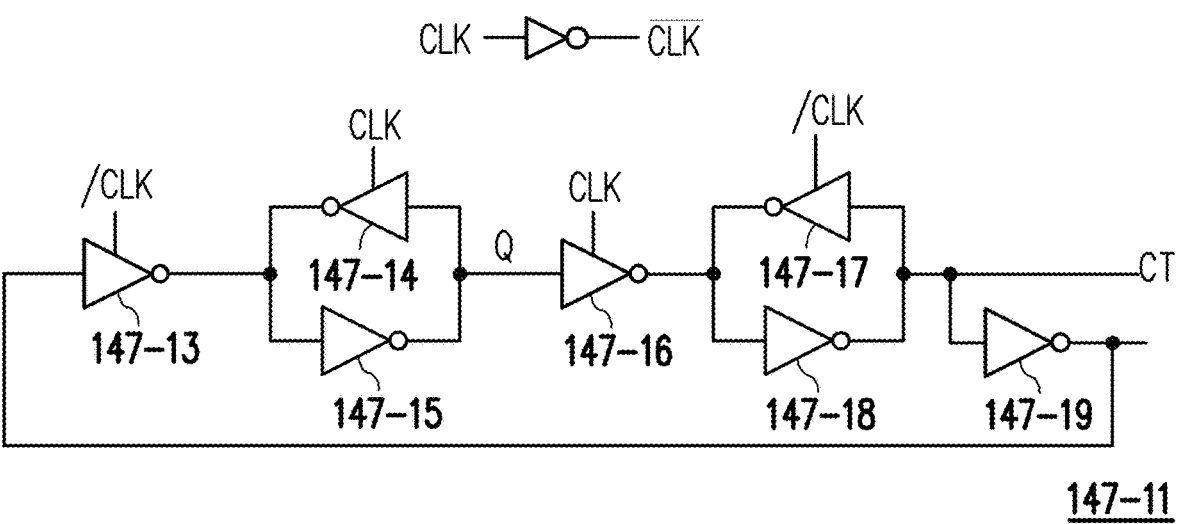
FIG. 8B is a schematic diagram illustrating a D flip-flop according to one of the exemplary embodiments of the disclosure.

FIG. 8B is a schematic diagram illustrating a D flip-flop 147-11 according to one of the exemplary embodiments of the disclosure. Referring to FIG. 8B, the D flip-flop 147-11 includes multiple inverters 147-13, 147-14, 147-15, 147-16, 147-17, 147-18, and 147-19. The input of the inverter 147-13 is the inverse/opposite of the clock signal/CLK which has the opposite value of the clock signal CLK. The output of the inverter 147-13 and the output of the inverter 147-14 is the input of the inverter 147-15. The output of the inverter 147-15 is the "Q"-output. The input of the inverter 147-16 is the clock signal CLK. The output of the inverter 147-16 and the output of the inverter 147-17 are the input of the inverter 147-18. The input of the inverter 147-17 is the inverse/opposite of the clock signal/CLK. The inputs of the inverters 147-17 and 147-19 are the control signal CT.

In one embodiment, the control signal is configured as one of a first value and a second value. The first or second value could be, for example, the logical "1" (e.g., a relatively high voltage) or the logical "0" (e.g., a relatively low voltage). The first and second values are different. For example, the first value is the logical "0" and the second value is the logical "1", alternatively, the first value is the logical "1" and the second value is the logical "0". The control signal may be the first value during the first cycle of the clock signal. The control signal may be the second value during the second cycle of the clock signal.

Figures 9, 10:
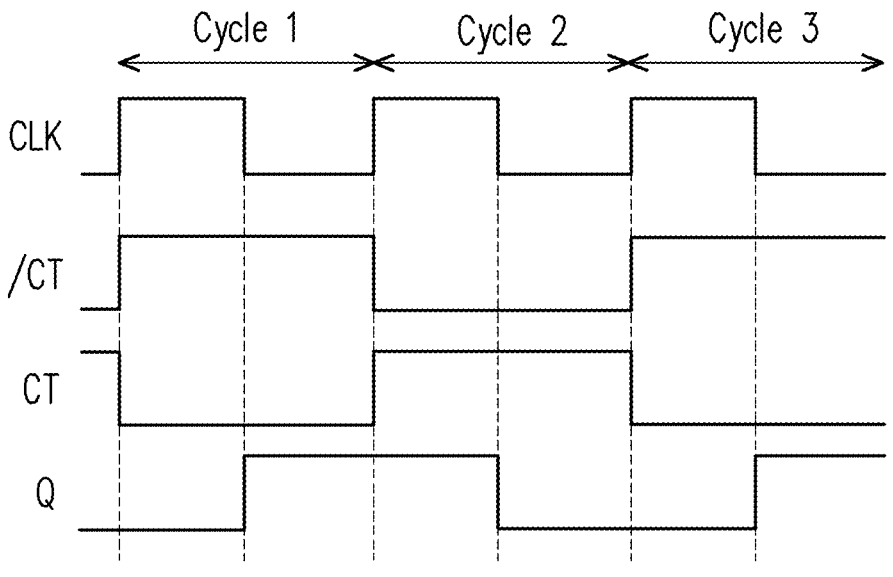
FIG. 9 is a timing chart of the operation of the counter circuit according to one of the exemplary embodiments of the disclosure.
FIG. 10 is a table illustrating the correspondence between cycle, control signal, and tracking word line/tracking bit line according to one of the exemplary embodiments of the disclosure.

FIG. 9 is a timing chart of the operation of the counter circuit 147-1 according to one of the exemplary embodiments of the disclosure. Referring to FIG. 9, in Cycle 1, the control signal CT becomes logical "0". In Cycle 2, the control signal CT becomes 1. Therefore, a 1-bit counter that alternates between two values is provided.

In one embodiment, referring to FIG. 7, a tracking word line signal is transmitted on one of the first tracking word line and the second tracking word line during a first cycle of a clock signal, and the tracking word line signal is transmitted on another one of the first tracking word line and the second tracking word line during a second cycle of the clock signal. For example, the tracking word line signal is transmitted on the tracking word line TRKWL[0] in cycle 1 of the clock signal CLK and transmitted on the tracking word line TRKWL[1] in cycle 2 of the clock signal CLK.

In one embodiment, the multiplexer 143-1 is configured to select one of the tracking word line TRKWL[0] and the tracking word line TRKWL[1] to transmit the tracking word line signal during the first cycle of the clock signal, and select another one of the tracking word line TRKWL[0] and the tracking word line TRKWL[1] to transmit the tracking word line signal during the second cycle of the clock signal. That is the multiplexer 143-1 switches from the tracking word line TRKWL[0] to the tracking word line TRKWL[1] or from the tracking word line TRKWL[1] to the tracking word line TRKWL[0] every cycle of the clock signal.

In one embodiment, the multiplexer 143-1 is configured to select one of the tracking word line TRKWL[0] and the tracking word line TRKWL[1] to transmit the tracking word line signal in response to receiving the control signal configured as the first value, and select another one of the tracking word line TRKWL[0] and the tracking word line TRKWL[1] to transmit the tracking word line signal in response to receiving the control signal configured as the second value. That is the multiplexer 143-1 switches from the tracking word line TRKWL[0] to the tracking word line TRKWL[1] or from the tracking word line TRKWL[1] to the tracking word line TRKWL[0] according to the value of the control signal.

In one embodiment, referring to FIG. 7, a tracking bit line signal is transmitted on one of the first tracking bit line and the second tracking bit line during a first cycle of a clock signal, and the tracking bit line signal is transmitted on another one of the first tracking bit line and the second tracking bit line during a second cycle of the clock signal. For example, the tracking bit line signal is transmitted on the tracking bit line TRKBL[0] in cycle 1 of the clock signal CLK and transmitted on the tracking bit line TRKBL[1] in cycle 2 of the clock signal CLK.

In one embodiment, the multiplexer 145-1 is configured to select one of the tracking bit line TRKBL[0] and the tracking bit line TRKBL[1] to transmit the tracking word line signal during the first cycle of the clock signal, and select another one of the tracking bit line TRKBL[0] and the tracking bit line TRKBL[1] to transmit the tracking bit line signal during the second cycle of the clock signal. That is the multiplexer 143-1 switches from the tracking bit line TRKBL[0] to the tracking bit line TRKBL[1] or from the tracking bit line TRKBL[1] to the tracking bit line TRKBL[0] every cycle of the clock signal.

In one embodiment, the multiplexer 145-1 is configured to select one of the tracking bit line TRKBL[0] and the tracking bit line TRKBL[1] to transmit the tracking bit line signal in response to receiving the control signal configured as the first value, and select another one of the tracking bit line TRKBL[0] and the tracking bit line TRKBL[1] to transmit the tracking bit line signal in response to receiving the control signal configured as the second value. That is the multiplexer 143-1 switches from the tracking bit line TRKBL[0] to the tracking bit line TRKBL[1] or from the tracking bit line TRKBL[1] to the tracking bit line TRKBL[0] according to the value of the control signal.

FIG. 10 is a table illustrating the correspondence between cycle, control signal, and tracking word line/tracking bit line according to one of the exemplary embodiments of the disclosure. Referring to FIG. 10, in Cycle 1, the control signal CT becomes logical "0", and the combination of the tracking word line TRKWL[0] and the tracking bit line TRKBL[0] is selected by the multiplexers 143-1 and 145-1. In Cycle 2, the control signal CT becomes logical "1", and the combination of the tracking word line TRKWL[1] and the tracking bit line TRKBL[1] is selected by the multiplexers 143-1 and 145-1. This correspondence continues every cycle of the clock signal CLK as shown in FIG. 10, and the further introduction would be omitted.

Figure 11:
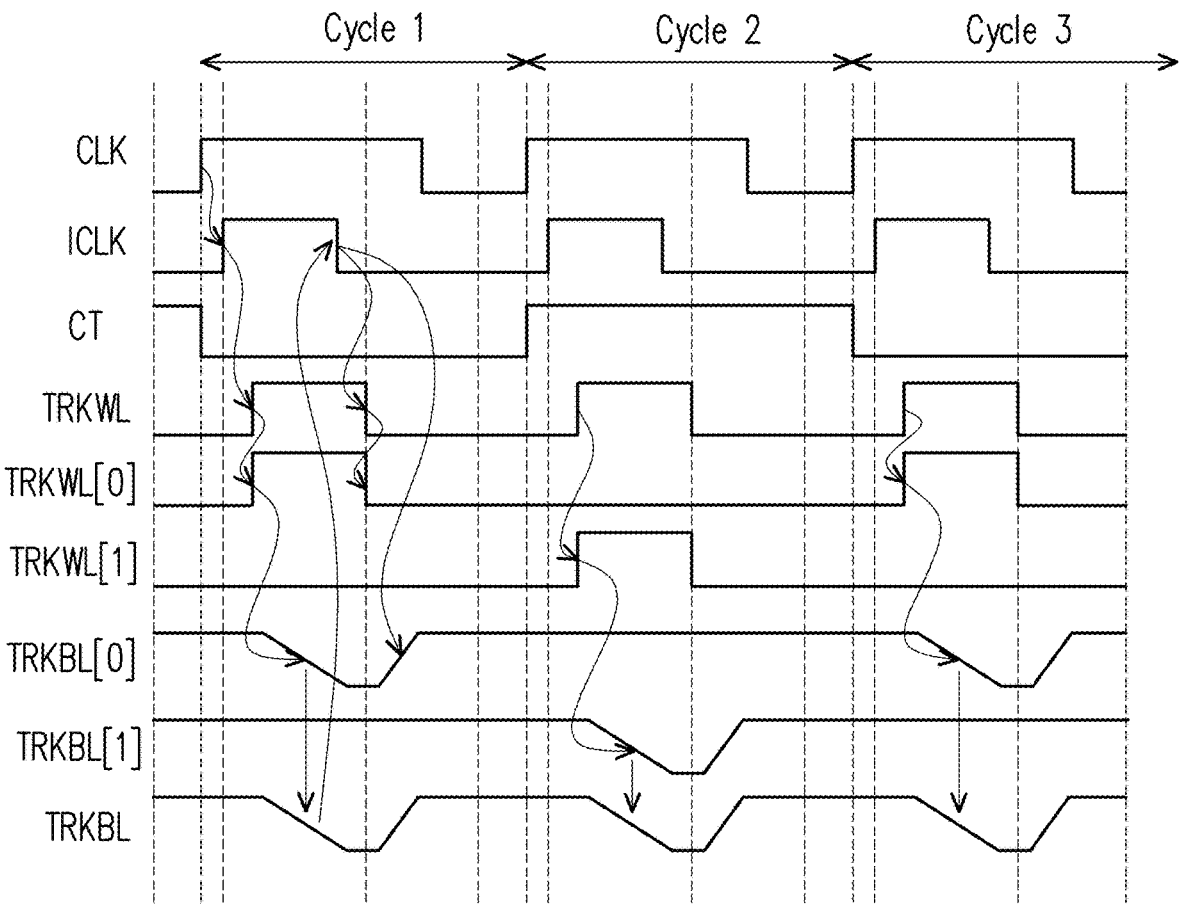
FIG. 11 is a timing chart of a tracking operation of the tracking cell according to one of the exemplary embodiments of the disclosure.

FIG. 11 is a timing chart of a tracking operation of the tracking cell according to one of the exemplary embodiments of the disclosure. Referring to FIG. 11, in Cycle 1, the control signal CT outputted from the counter circuit 147-1 is logical "0", and accordingly, the output of multiplexer 143-1 is switched to the tracking word line TRKWL[0], making the master tracking word line TRKWL equal to and be connected to the tracking word line TRKWL[0]. Since the tracking bit line TRKBL[0] is connected to the tracking word line TRKWL[0] (for example, as shown in FIG. 6), when the tracking word line TRKWL[0] becomes logical "0", the TRK cell pulls out the charge of the tracking bit line TRKBL[0], and the voltage of the tracking bit line TRKBL[0] drops. Similarly, the output of multiplexer 145-1 is switched to the tracking bit line TRKBL[0] in response to the control signal CT of the counter circuit 147-1 being logical "0", and results in making the master tracking bit line TRKBL equal to and be connected to the tracking bit line TRLBL[0].

In Cycle 2, the control signal CT outputted from the counter circuit 147-1 is logical "1", and accordingly, the output of multiplexer 143-1 is switched to the tracking word line TRKWL[1], making the master tracking word line TRKWL equal to and be connected to the tracking word line TRKWL[1]. Since the tracking bit line TRKBL[1] is connected to the tracking word line TRKWL[1] (for example, as shown in FIG. 6), when the tracking word line TRKWL[1] becomes logical "1", the TRK cell pulls out the charge of the tracking bit line TRKBL[1], and the voltage of the tracking bit line TRKBL[1] drops. Similarly, the output of multiplexer 145-1 is switched to the tracking bit line TRKBL[1] in response to the control signal CT of the counter circuit 147-1 being logical "1", and results in making the master tracking bit line TRKBL equal to and be connected to the tracking bit line TRLBL[1].

In Cycle 3, the control signal CT of the counter circuit 147-1 returns to logical "0" and performs the same operation as Cycle 1. From Cycle 4 onwards, it performs the same operation while switching the control signal CT.

By switching the pair of the tracking word line TRKWL[0] and the tracking bit line TRKBL[0]/the pair of the tracking word line TRKWL[1] and the tracking bit line TRKBL[1] with the counter circuit 147-1, the tracking word line TRKWL[0] and the tracking word line TRKWL[1]/the tracking bit line TRKBL[0] and the tracking bit line TRKBL[1] operates once every two times, and thus reducing the toggle rate to ½ and decreasing EM.

Figure 12:
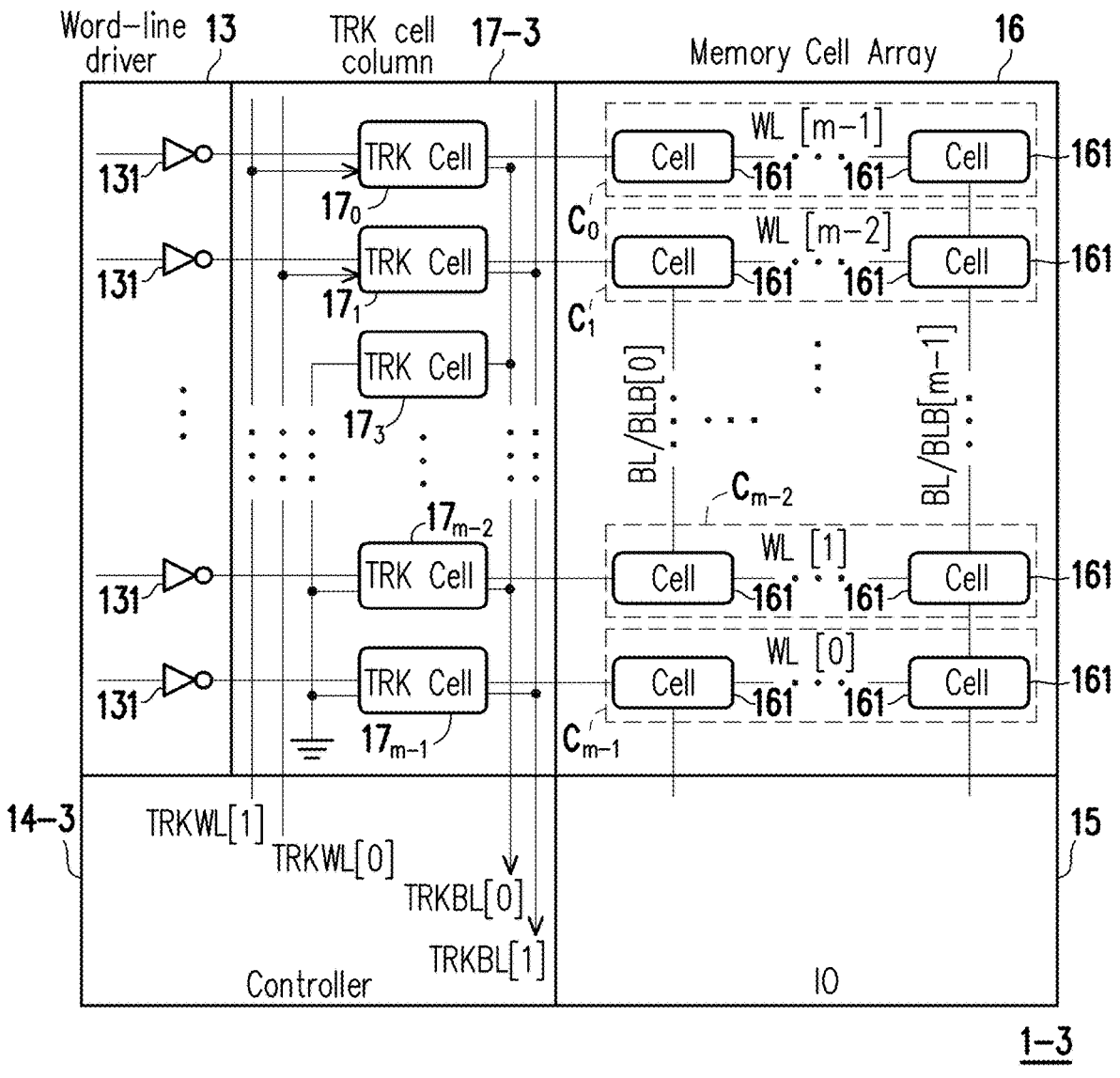
FIG. 12 is a schematic diagram illustrating a memory according to one of the exemplary embodiments of the disclosure.

FIG. 12 is a schematic diagram illustrating a memory 1-3 according to one of the exemplary embodiments of the disclosure. Referring to FIG. 12, the memory 1-3 includes (but is not limited to) tracking word lines TRKWL[0] and TRKWL[1], tracking bit lines TRKBL[0] and TRKBL[1], a word-line driver 13, a controller 14-3, an IO circuit 15, a memory cell array 16, and a tracking cell column 17-3.

Compared with the memory 1-2 as shown in FIG. 6, the differences are that the tracking word line TRKWL[1] is coupled to the TRK cell $17_0$ (for example, wiring of the master tracking word line TRKWL which is connected to the gate of PG transistor PG as shown in FIG. 3), and the tracking word line TRKWL[0] is coupled to the TRK cell $17_1$. In some embodiments, the tracking word line TRKWL[0] or the tracking word line TRKWL[1] may be further coupled to other TRK cells such as one or more of TRK cell $17_3$ to the TRK cell $17_{m-1}$.

Figures 13, 14:
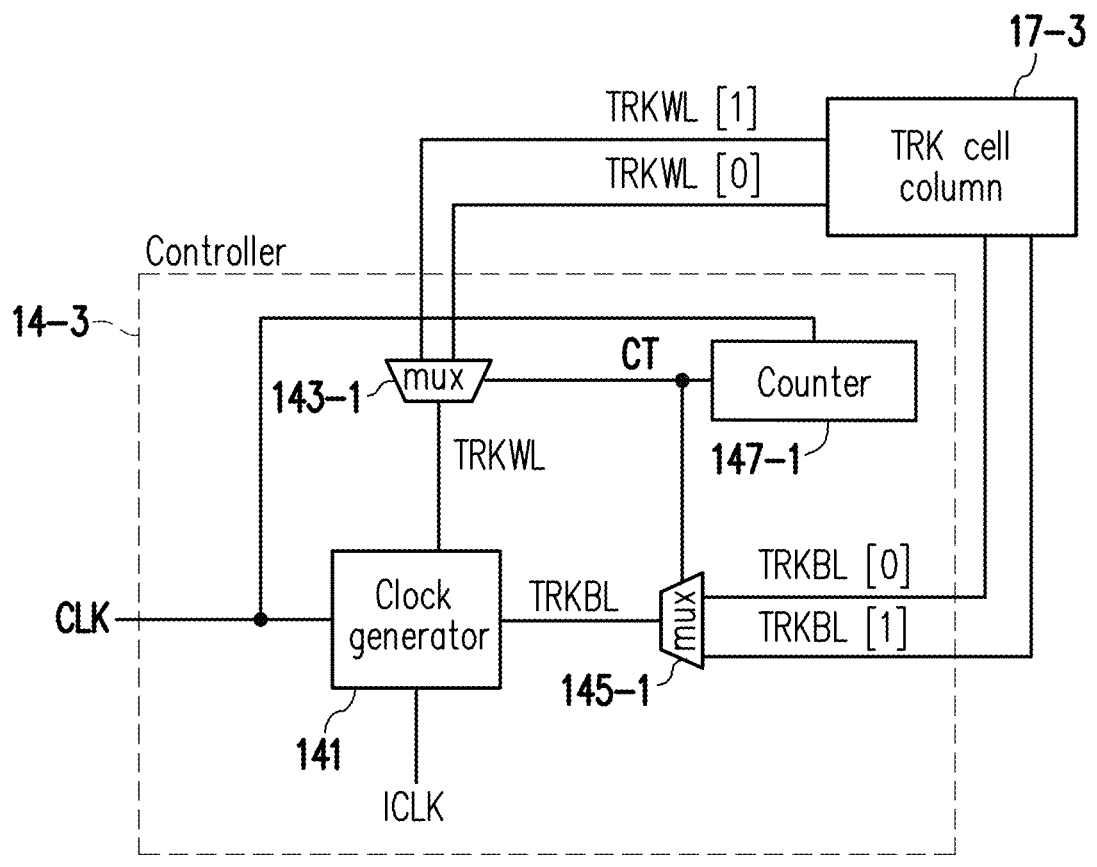
FIG. 13 is a schematic diagram illustrating a controller and a tracking cell column according to one of the exemplary embodiments of the disclosure.
FIG. 14 is a table illustrating the correspondence between cycle, control signal, and tracking word line/tracking bit line according to one of the exemplary embodiments of the disclosure.

FIG. 13 is a schematic diagram illustrating a controller 14-3 and a tracking cell column 17-3 according to one of the exemplary embodiments of the disclosure. Referring to FIG. 13, the controller 14-2 includes the clock generator 141, two multiplexers 143-1 and 145-1, and a counter circuit 147-1.

FIG. 14 is a table illustrating the correspondence between cycle, control signal, and tracking word line/tracking bit line according to one of the exemplary embodiments of the disclosure. Referring to FIG. 14, in Cycle 1, the control signal CT becomes logical "0", and the combination of the tracking word line TRKWL[1] and the tracking bit line TRKBL[0] is selected by the multiplexers 143-1 and 145-1. In Cycle 2, the control signal CT becomes logical "1", and the combination of the tracking word line TRKWL[0] and the tracking bit line TRKBL[1] is selected by the multiplexers 143-1 and 145-1. This correspondence continues every cycle of the clock signal CLK as shown in FIG. 14, and further introduction would be omitted.

Figure 15:
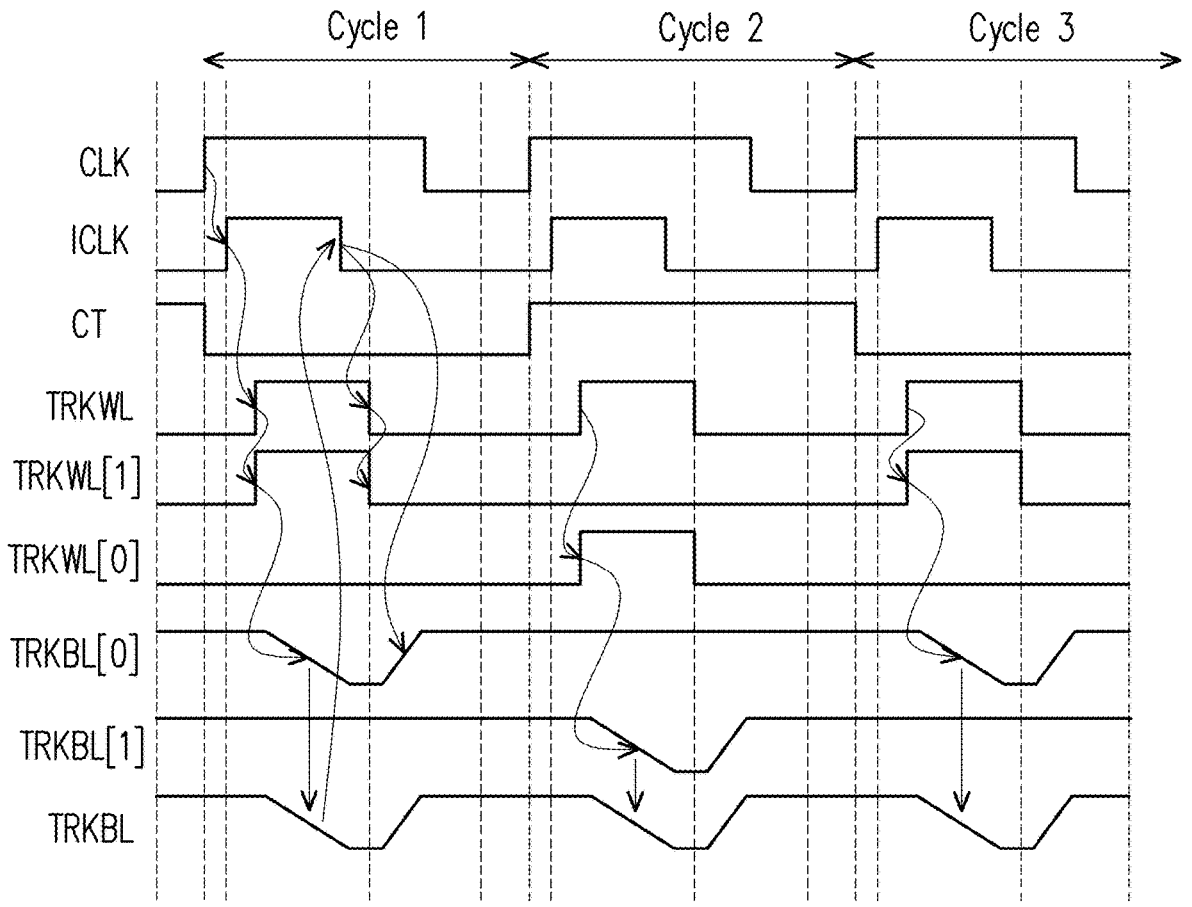
FIG. 15 is a timing chart of a tracking operation of the tracking cell according to one of the exemplary embodiments of the disclosure.

FIG. 15 is a timing chart of a tracking operation of the tracking cell according to one of the exemplary embodiments of the disclosure. Referring to FIG. 15, in Cycle 1, the control signal CT outputted from the counter circuit 147-1 is logical "0", and accordingly, the output of multiplexer 143-1 is switched to the tracking word line TRKWL[1], making the master tracking word line TRKWL equal to and be connected to the tracking word line TRKWL[1]. Since the tracking bit line TRKBL[0] is connected to the tracking word line TRKWL[1] (for example, as shown in FIG. 12), when the tracking word line TRKWL[1] becomes logical "1", the TRK cell pulls out the charge of the tracking bit line TRKBL[0], and the voltage of the tracking bit line TRKBL[0] drops. Similarly, the output of multiplexer 145-1 is switched to the tracking bit line TRKBL[0] in response to the control signal CT of the counter circuit 147-1 being logical "0", and results in making the master tracking bit line TRKBL equal to and be connected to the tracking bit line TRLBL[0].

In Cycle 2, the control signal CT outputted from the counter circuit 147-1 is logical "1", and accordingly, the output of multiplexer 143-1 is switched to the tracking word line TRKWL[0], making the master tracking word line TRKWL equal to and be connected to the tracking word line TRKWL[0]. Since the tracking bit line TRKBL[1] is connected to the tracking word line TRKWL[0] (for example, as shown in FIG. 12), when the tracking word line TRKWL[0 becomes logical "1", the TRK cell pulls out the charge of the tracking bit line TRKBL[1], and the voltage of the tracking bit line TRKBL[1] drops. Similarly, the output of multiplexer 145-1 is switched to the tracking bit line TRKBL[1] in response to the control signal CT of the counter circuit 147-1 being logical "1", and results in making the master tracking bit line TRKBL equal to and be connected to the tracking bit line TRLBL[1].

In Cycle 3, the control signal CT of the counter circuit 147-1 returns to logical "0" and performs the same operation as Cycle 1.

Figure 16:
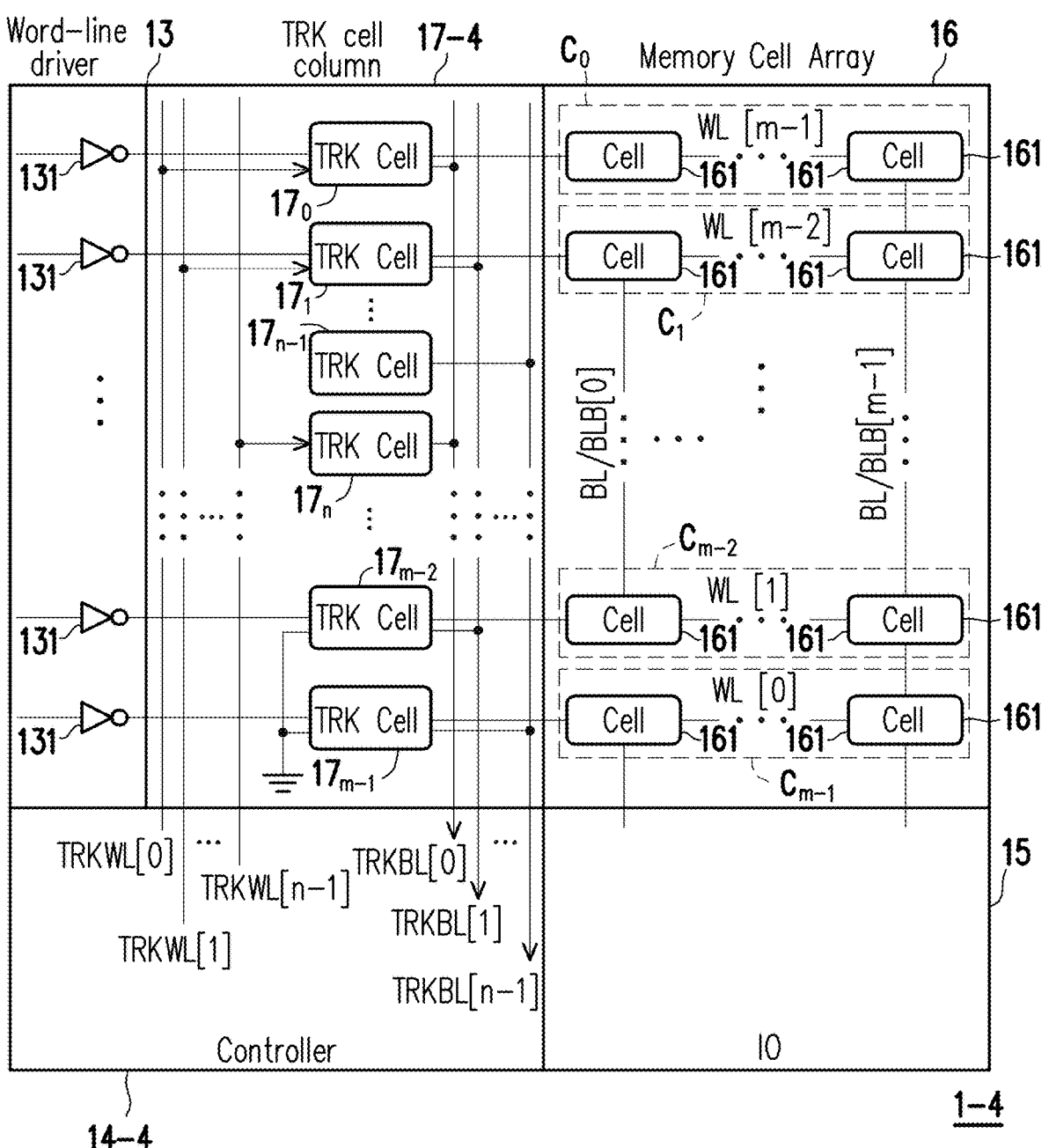
FIG. 16 is a schematic diagram illustrating a memory according to one of the exemplary embodiments of the disclosure.

FIG. 16 is a schematic diagram illustrating a memory 1-4 according to one of the exemplary embodiments of the disclosure. Referring to FIG. 16, the memory 1-4 includes (but is not limited to) tracking n word lines TRKWL[0] to TRKWL[n−1], n tracking bit lines TRKBL[0] to TRKBL[n−1], a word-line driver 13, a controller 14-4, an IO circuit 15, a memory cell array 16, and a tracking cell column 17-4.

Compared with the memory 1-2 as shown in FIG. 6, the differences are that multiple tracking word lines TRKWL[2] to TRKWL[n−1] are further provided, where each of the tracking word lines TRKWL[2] to TRKWL[n−1] is coupled to one TRK cell (for example, wiring of the master tracking word line TRKWL which is connected to the gate of PG transistor PG as shown in FIG. 3). That is n tracking word lines and n tracking bit lines are provided. n if is an integer larger than two. n may be less than or equal to m. For example, the tracking word line TRKWL[n−1] is coupled to the TRK cell $17_{n-1}$. In some embodiments, the tracking word lines TRKWL[0] to the tracking word lines TRKWL[n−1] may be further coupled to other TRK cells such as one or more of TRK cell $17_n$ to the TRK cell $17_{m-1}$. Furthermore, multiple tracking bit lines TRKBL[2] to TRKBL[n−1] are further provided, where each of the tracking bit lines TRKBL[2] to TRKBL[n−1] is coupled to one or more TRK cells (such as the TRK cell $17_{n-1}$, $17_{m-1}$, and $17_{m-2}$) (for example, wiring of the master tracking bit line TRKBL which is connected to the source of PG transistor PG as shown in FIG. 3). In some embodiments, the tracking bit line TRKBL[0] to the tracking bit line TRKBL[m−1] may be further coupled to other TRK cells such as one or more of TRK cell $17_0$ to the TRK cell $17_{m-1}$.

It should be noted that each of the n tracking word lines (such as the tracking word lines TRKWL [0] to TRKWL [n−1]) is connected to one TRK cell. In one embodiment, the connection to each TRK cell is varied based on the actual requirement. Furthermore, prepare wiring for the tracking bit lines TRKBL [0] to TRKBL [n−1] corresponding to the tracking word lines TRKWL [0] to TRKWL [n−1], respectively. The master tracking bit line TRKBL connected to the TRK cell with the tracking word line TRKWL [0] is connected to the wiring of the tracking bit line TRKBL [0]. The master tracking bit line TRKBL connected to the TRK cell with the tracking word line TRKWL [1] is connected to the wiring of the tracking bit line TRKBL [1]. The master tracking word line TRKBL connected to the TRK cell with the tracking word line TRKWL [k] is connected to the wiring of the tracking bit line TRKBL [k]. k is an integer between 0 and n−1. For other unused TRK cells (such as TRL cell $17_n$ to $17_{m-1}$) without connection to the tracking word lines TRKWL [0] to TRKWL [n−1], the master tracking bit line TRKBL can be connected to any tracking bit line TRKBL [k]. However, in some embodiments, to ensure that the memory operates without changes in timing between cycles, it may keep the differences between the tracking bit lines TRKBL [0] to TRKBL [n−1] small, so the same number of TRK cells may be connected to each tracking bit line TRKBL [k]. Similarly, for the tracking word lines TRKWL [0] to TRLWL [n−1], the same number of TRK cells may be connected to the tracking word line TRKWL [k] for the same reasons, but it is not limited thereto.

Figure 17:
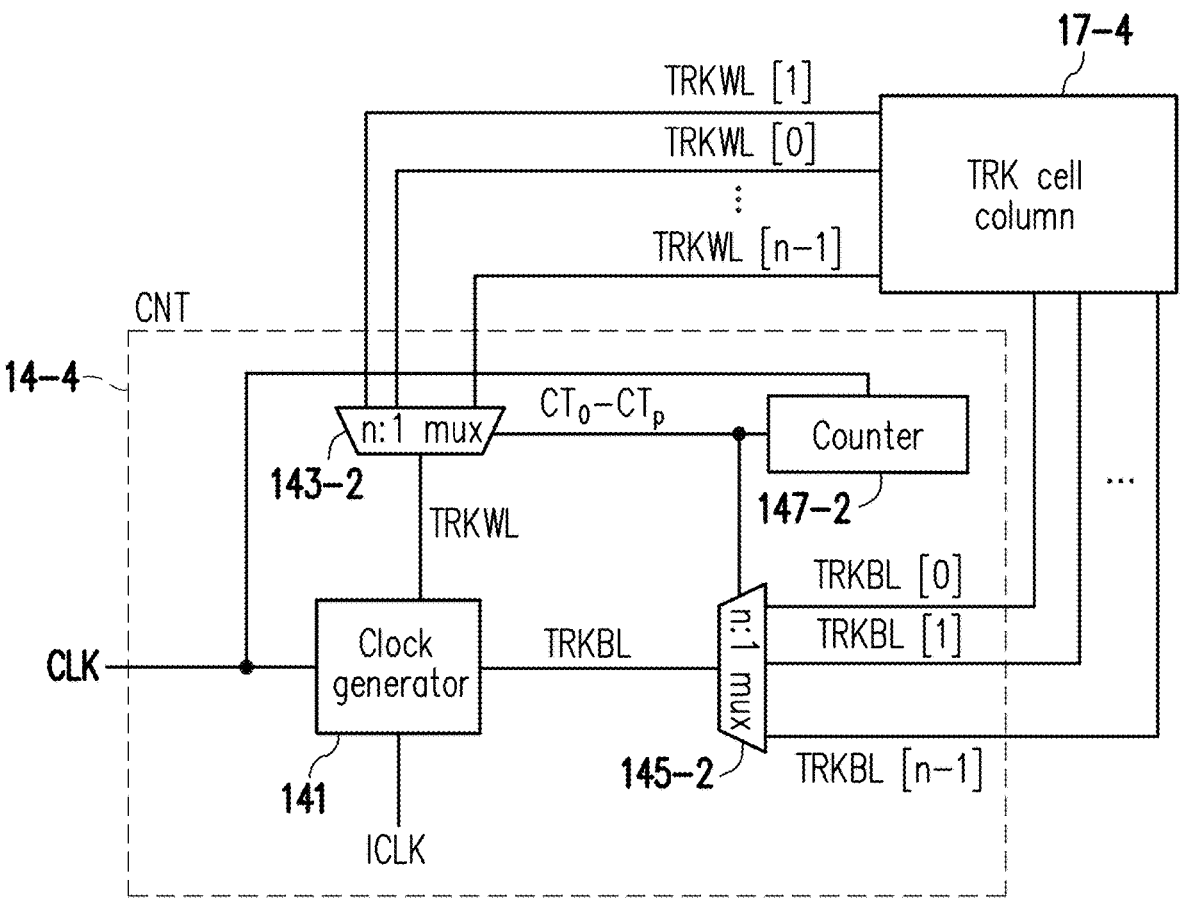
FIG. 17 is a schematic diagram illustrating a controller and a tracking cell column according to one of the exemplary embodiments of the disclosure.

FIG. 17 is a schematic diagram illustrating a controller 14-4 and a tracking cell column 17-4 according to one of the exemplary embodiments of the disclosure. Referring to FIG. 17, compared with the controller 14-2 as shown in FIG. 7, the differences are that the controller 14-2 includes two multiplexers 143-2 and 145-2 and a counter circuit 147-2. Furthermore, n tracking word lines TRKWL [0] to TRKWL [n−1] and n tracking bit lines TRKBL [0] to TRKBL [n−1] are connected to the track cell column 17-4.

The multiplexer or demultiplexer (mux) 143-2 is coupled to the master tracking word line TRKWL, the n tracking word lines TRKWL [0] to TRKWL [n−1]. In one embodiment, the multiplexer 143-2 is configured to receive the tracking word line signal from the master tracking word line TRKWL, and select one of the n tracking word lines TRKWL [0] to TRKWL [n−1] to output the tracking word line signal.

The multiplexer (mux) 145-2 is coupled to the master tracking bit line TRKBL, the n tracking bit lines TRKBL [0] to TRKBL [n−1]. In one embodiment, the multiplexer 145-2 is configured to select one of the n tracking bit lines TRKBL [0] to TRKBL [n−1] to receive the tracking bit line signal, and transmit the tracking bit line signal to the master tracking bit line TRKBL.

The counter circuit 147-2 is coupled to the multiplexer 143-2 and the multiplexer 145-2. In one embodiment, the counter circuit 147-2 is configured to receive the clock signal CLK, and transmit control signals $CT_0$ to $CT_p$ to the multiplexer 143-2 and the multiplexer 145-2, respectively. In one embodiment, p is $(\log_2 n)-1$. In another embodiment, p is an integer less than or equal to n−1.

Figure 18:
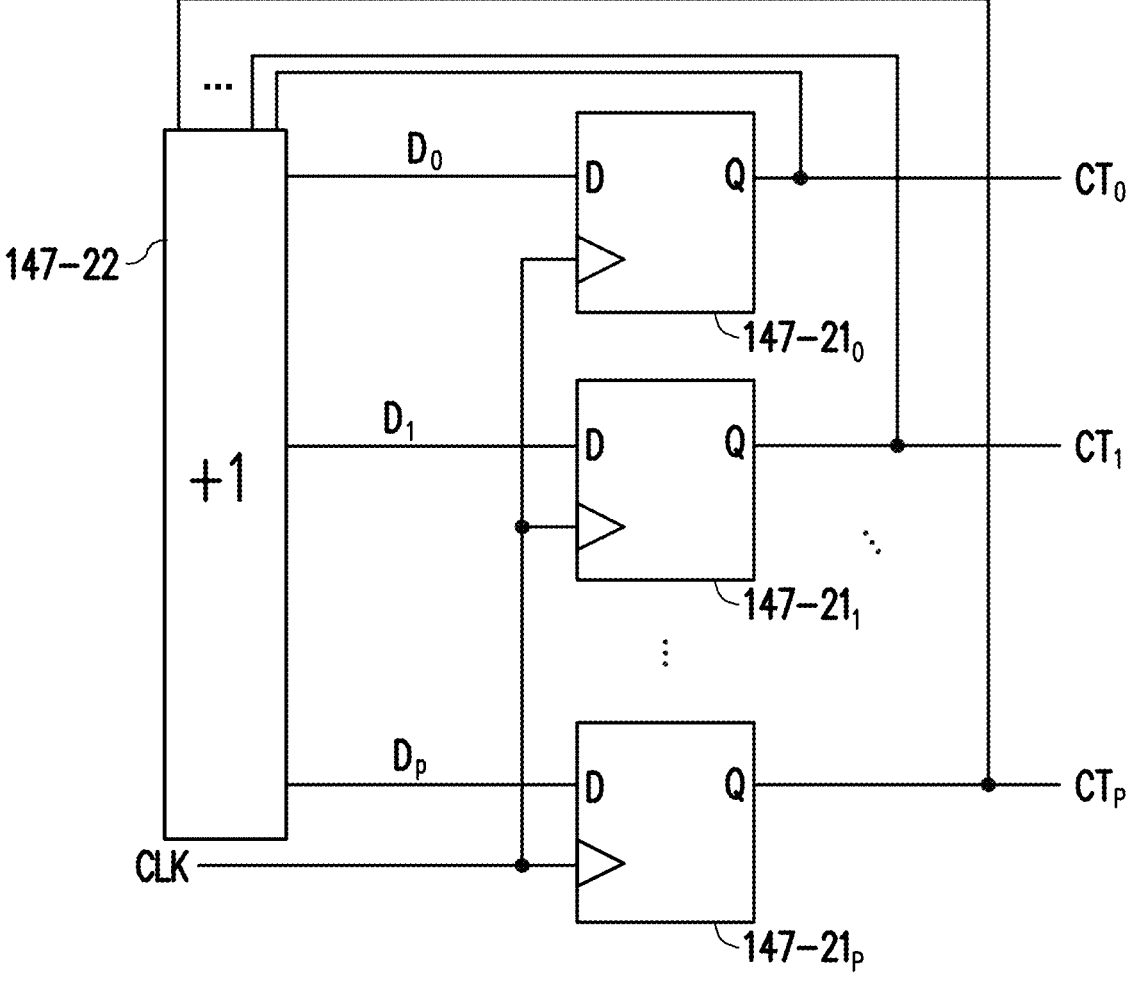
FIG. 18 is a schematic diagram illustrating the counter circuit according to one of the exemplary embodiments of the disclosure.

FIG. 18 is a schematic diagram illustrating the counter circuit 147-2 according to one of the exemplary embodiments of the disclosure. Referring to FIG. 147-2, the counter circuit 147-2 is configured as (p+1)-bit output, and the counter circuit 147-2 includes p D-FFs $147\text{-}21_0$ to $147\text{-}21_p$ and an adder circuit 147-22. The "D"-input of each of the p D-FFs $147\text{-}21_0$ to 147-21p is coupled to the outputs of the adder circuit 147-22 (i.e., receiving one of the data signals $D_0$ to $D_p$). The inputs of the adder circuit 147-22 are the control signals $CT_0$ to $CT_p$ which are the "Q"-outputs of the p D-FFs $147\text{-}21_0$ to $147\text{-}21_p$. The clock input of each of the p D-FFs $147\text{-}21_0$ to $147\text{-}21_p$ is configured to receive the clock signal CLK.

In one embodiment, the control signal outputted from the counter circuit 147-2 may be encoded as a (p−1)-bit value in which each bit in the (p−1)-bit value is one of the values of the control signals $CT_0$ to $CT_p$.

FIG. 19 is a table illustrating the correspondence between control signals $CT_0$ to $CT_p$ and data signals $D_0$ to $D_p$ according to one of the exemplary embodiments of the disclosure. Referring to FIG. 19, the control signal outputted from the counter circuit 147-2 may be a (p+1)-bit value, in which p is $(\log_2 n)-1$. The (p+1)-bit value is composed of the values of the control signals $CT_0$ to $CT_p$. For example, in the first row of the table, the control signal is encoded as logical "00 . . . 0" which is all logical "0" in all control signals $CT_0$ to $CT_p$. The control signals $CT_0$ to $CT_p$ increase from all logical "0" to all logical "1" by 1 increment, and then it returns to all logical "0" with 1 increment in each cycle. On the other hand, the data signals $D_0$ to $D_p$ increase from logical "00 . . . 01" to all logical "0", and then it returns to logical "00 . . . 01".

In one embodiment, referring to FIG. 17, the multiplexer 143-2 is configured to select one of the tracking word line TRKWL [0] to the tracking word line TRKWL [n−1] to transmit the tracking word line signal from the master tracking word line TRKWL according to a control signal, where the control signal is configured as one of n values, and the n values are encoded in $\log_2$ n bits. Each value of the control signal corresponds to one of the tracking word line TRKWL [0] to the tracking word line TRKWL [n−1].

In one embodiment, the multiplexer 143-2 is configured to select one of the tracking word line TRKWL [0] to the tracking word line TRKWL [n−1] to transmit the tracking word line signal during the (k+1)-th cycle of the clock signal, and select another one of the tracking word line TRKWL [0] to the tracking word line TRKWL [n−1] to transmit the tracking word line signal during the (k+2)-th cycle of the clock signal, where k is an integer between 0 and n−1. That is the multiplexer 143-2 switches from one of the tracking word line TRKWL [0] to the tracking word line TRKWL [n−1] to another one of the tracking word line TRKWL [0] to the tracking word line TRKWL [n−1] every cycle of the clock signal.

In one embodiment, the multiplexer 143-2 is configured to select one of the tracking word line TRKWL [0] to the tracking word line TRKWL [n−1] to transmit the tracking word line signal in response to receiving the control signal configured as the (k+1)-th value, and select another one of the tracking word line TRKWL [0] to the tracking word line TRKWL [n−1] to transmit the tracking word line signal in response to receiving the control signal configured as the (k+2)-th value. That is the multiplexer 143-2 switches from one of the tracking word line TRKWL [0] to the tracking word line TRKWL[n−1] to another one of the tracking word line TRKWL [0] to the tracking word line TRKWL [n−1] according to the value of the control signal.

In one embodiment, referring to FIG. 17, the multiplexer 145-2 is configured to select one of the tracking bit line TRKBL [0] to the tracking bit line TRKBL [n−1] to transmit the tracking bit line signal to the master tracking bit line TRKBL according to a control signal, where the control signal is configured as one of n values, and the n values are encoded in $\log_2$ n bits. Each value of the control signal corresponds to one of the tracking bit line TRKBL [0] to the tracking bit line TRKBL [n−1].

In one embodiment, the multiplexer 145-2 is configured to select one of the tracking bit line TRKBL [0] to the tracking bit line TRKBL [n−1] to transmit the tracking bit line signal during the (k+1)-th cycle of the clock signal, and select another one of the tracking bit line TRKBL [0] to the tracking bit line TRKBL [n−1] to transmit the tracking bit line signal during the (k+2)-th cycle of the clock signal, where k is an integer between 0 and n−1. That is the multiplexer 145-2 switches from one of the tracking bit line TRKBL [0] to the tracking bit line TRKBL [n−1] to another one of the tracking bit line TRKBL [0] to the tracking bit line TRKBL [n−1] every cycle of the clock signal.

In one embodiment, the multiplexer 145-2 is configured to select one of the tracking bit line TRKBL [0] to the tracking bit line TRKBL [n−1] to transmit the tracking bit line signal in response to receiving the control signal configured as the (k+1)-th value, and select another one of the tracking bit line TRKBL [0] to the tracking bit line TRKBL [n−1] to transmit the tracking bit line signal in response to receiving the control signal configured as the (k+2)-th value, where k is an integer between 0 and n−1. That is the multiplexer 145-2 switches from one of the tracking bit line TRKBL [0] to the tracking bit line TRKBL [n−1] to another one of the tracking bit line TRKBL [0] to the tracking bit line TRKBL [n−1] according to the value of the control signal.

For example, FIG. 20 is a table illustrating the correspondence between cycle, control signal, and tracking word line/tracking bit line according to one of the exemplary embodiments of the disclosure. Referring to FIG. 20, in Cycle 1, the control signals $CT_0$ to $CT_p$ are all logical "0", and the combination of the tracking word line TRKWL[0] and the tracking bit line TRKBL[0] is selected by the multiplexers 143-2 and 145-2. In Cycle 2, the control signals $CT_1$ to $CT_p$ are all logical "0" and the control signal $CT_0$ is logical "1", and the combination of the tracking word line TRKWL[1] and the tracking bit line TRKBL[1] is selected by the multiplexers 143-2 and 145-2. In Cycle n, the control signals $CT_0$ to $CT_p$ are all logical "1", and the combination of the tracking word line TRKWL[n−1] and the tracking bit line TRKBL[n−1] is selected by the multiplexers 143-2 and 145-2.

In one embodiment, the tracking word line TRKWL[0] to TRLWL[n−1] and the tracking bit line TRKBL[0] to TRKBL[n−1] would be switched for each cycle. For example, the combination of the tracking word line TRKWL[n−1] and the tracking bit line TRKBL[0] is used when the control signal CT equals 0, and the combination of the tracking word line TRKWL[0] and the tracking bit line TRKBL[n−1] is used when the control signal CT equals 1. It should be noted that the initial value of the control signal CT can be any value based on the actual requirement.

Figure 21:
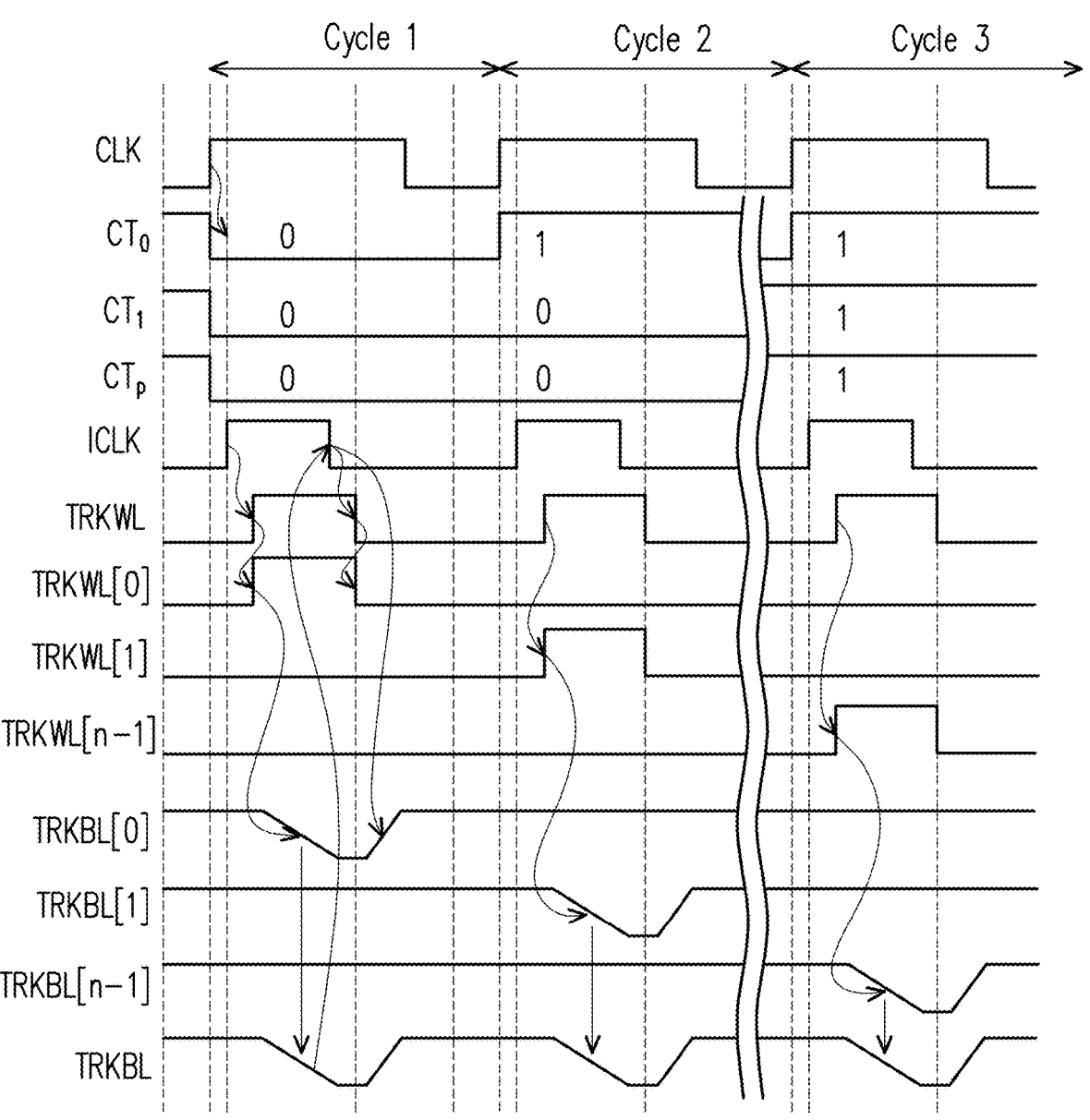
FIG. 21 is a timing chart of a tracking operation of the tracking cell according to one of the exemplary embodiments of the disclosure.

FIG. 21 is a timing chart of a tracking operation of the tracking cell according to one of the exemplary embodiments of the disclosure. Referring to FIG. 21, in Cycle 1, the control signals $CT_0$ to $CT_p$ of the counter circuit 147-2 are all logical "0", and as a result, the output of the multiplexer 143-2 is switched to the tracking word line TRKWL[0], and result in making the master tracking word line TRKWL equal to and be connected to the tracking word line TRKWL [0]. Since the tracking bit line TRKBL[0] is connected to the tracking word line TRKWL[0] (for example, as shown in FIG. 16), when the tracking word line TRKWL[0] becomes the tracking word line, the TRK cell pulls the charge from the tracking bit line TRKBL[0], making the voltage of the tracking bit line TRKBL[0] to drop. Similarly, the control signals $CT_0$ to $CT_p$ of the counter circuit 147-2 are all logical "0", and as a result, the output of the multiplexer 145-2 is switched to the tracking bit line TRKBL[0], and result in making the master tracking bit line TRKBL equal to and be connected to the tracking bit line TRLBL[0].

In Cycle 2, the control signals $CT_1$ to $CT_p$ of the counter circuit 147-2 are all logical "0", and the control signal $CT_0$ is logical "1", causing the output of the multiplexer 143-2 to switch to the tracking word line TRKWL[1], making the master tracking word line TRKWL equal to and be connected to the tracking word line TRKWL[1]. Since the tracking bit line TRKBL[1] is connected to the tracking word line TRKWL[1] (for example, as shown in FIG. 16), when the tracking word line TRKWL[1] becomes logical "1", the TRK cell pulls the charge from the tracking bit line TRKBL[1], causing the voltage of the tracking bit line TRKBL[1] to drop. Similarly, the output of the multiplexer 145-2 is switched to the tracking bit line TRKBL[1] based on the control signal CT of the counter circuit 147-2 (where the control signal CT is composed of the control signals $CT_0$ to $CT_p$), making the master tracking bit line TRKBL equal to and be connected to the tracking bit line TRLBL[1].

In Cycle n, the control signals $CT_0$ to $CT_p$ of the counter circuit 147-2 are all logical "1", causing the output of the multiplexer 143-2 to switch to the tracking word line TRKWL [n−1], making the tracking word line TRKWL equal to and be connected to the tracking word line TRKWL [n−1]. Since the tracking bit line TRKBL [n−1] is connected to the tracking word line TRKWL [n−1] (for example, as shown in FIG. 16), when the tracking word line TRKWL [n−1] becomes logical "1", the TRK cell pulls the charge from the tracking bit line TRKBL [n−1], causing the voltage of the tracking bit line TRKBL[n−1] to drop. Similarly, the output of multiplexer 145-2 is switched to the tracking bit line TRKBL [n−1] based on the control signal CT of the counter circuit 147-2, making the tracking bit line TRKBL equal to and be connected to the tracking bit line TRLBL [n−1].

In Cycle n+1, the control signal CT of the counter circuit 147-2 returns to all logical "0" and the same operation as Cycle 1 is performed. From Cycle n+1 onwards, the same operation is performed while switching control signal CT.

By switching the pairs of the tracking word lines TRKWL [0] to TRKWL[n−1] and the tracking bit lines TRKBL[0] to TRKBL[n−1] using the counter circuit 147-2, each pair of the tracking word lines TRKWL[0] to TRKWL[n−1] and the tracking bit lines TRKBL[0] to TRKBL[n−1] only operates once every n cycles, and thus reducing the toggle rate to 1/n and reducing EM.

Figure 22A:
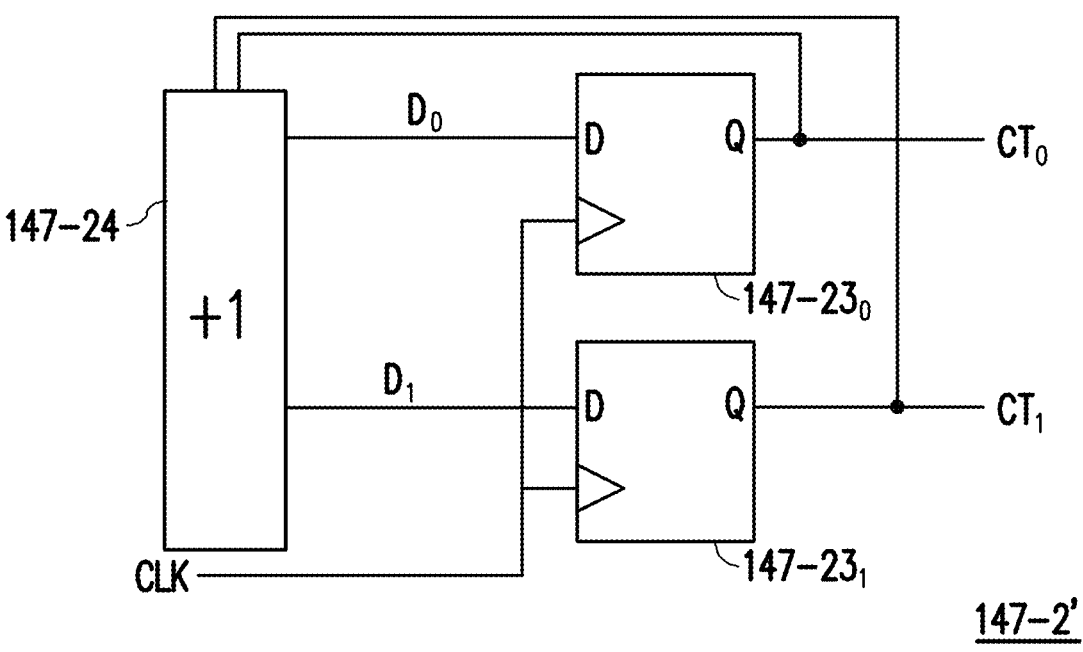
FIG. 22A is a schematic diagram illustrating the counter circuit according to one of the exemplary embodiments of the disclosure.

FIG. 22A is a schematic diagram illustrating the counter circuit 147-2' according to one of the exemplary embodiments of the disclosure. Referring to FIG. 22A, taking n=4 as an example, the counter circuit 147-2' is configured as 2-bit output, and the counter circuit 147-2' includes two D-FFs $147\text{-}23_0$ and $147\text{-}23_1$ and an adder circuit 147-24. The "D"-input of each of the D-FFs $147\text{-}23_0$ and $147\text{-}23_1$ is coupled to the outputs of the adder circuit 147-24 (i.e., receiving one of the data signals $D_0$ to $D_1$). The inputs of the adder circuit 147-24 are the control signals $CT_0$ to $CT_1$ which are the "Q"-outputs of the D-FFs $147\text{-}23_0$ to $147\text{-}23_1$. The clock input of each of the D-FFs $147\text{-}23_0$ to $147\text{-}23_1$ is configured to receive the clock signal CLK.

Figure 22B:
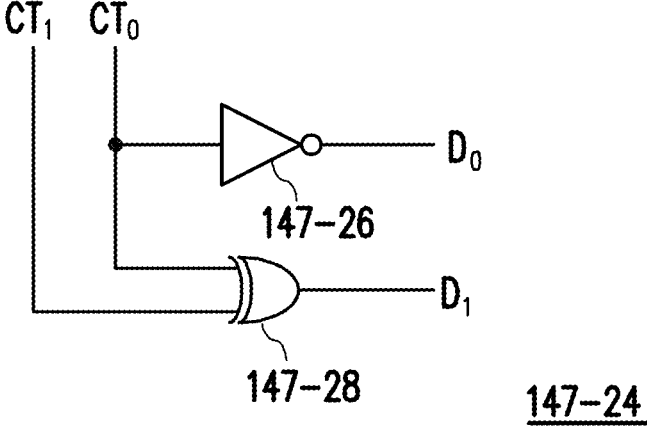
FIG. 22B is a schematic diagram illustrating the adder circuit according to one of the exemplary embodiments of the disclosure.

FIG. 22B is a schematic diagram illustrating the adder circuit 147-24 according to one of the exemplary embodiments of the disclosure. Referring to FIG. 22B, the adder circuit 147-24 includes an inverter 147-26 and an XOR gate 147-28. The input of the inverter 147-26 is the control signal $CT_0$. The output of the inverter 147-26 is the data signal $D_0$. The inputs of the XOR gate 147-28 are the control signals $CT_0$ and $CT_1$. The output of the XOR gate 147-28 is the data signal $D_1$.

FIG. 23 is a table illustrating the correspondence between control signals $CT_1$ and $CT_1$ and data signals $D_0$ and $D_1$ according to one of the exemplary embodiments of the disclosure. Referring to FIG. 23, the control signals $CT_0$ and $CT_1$ increase by 1 from all logical "0" to all logical "1", and then return to all logical "0" and increase by 1 again. On the other hand, the data signals $D_0$ and $D_1$ increase from logical "01" to all logical "0", and then it returns to logical "01".

FIG. 24 is a table illustrating the correspondence between cycle, control signal, and tracking word line/tracking bit line according to one of the exemplary embodiments of the disclosure. Referring to FIG. 24, in Cycle 1, the control signals $CT_0$ and $CT_1$ are all logical "0" and the pair of the tracking word line TRKWL[0] and the tracking bit line TRKBL[0] is selected by the multiplexers 143-2 and 145-2. In Cycle 2, the control signal CT is logical "0", the control signal $CT_0$ is logical "1", and the pair of the tracking word line TRKWL[1] and the tracking bit line TRKBL[1] is selected by the multiplexers 143-2 and 145-2. In Cycle 4, the control signals $CT_0$ and $CT_1$ are all logical "1" and the pair of the tracking word line TRKWL[3] and the tracking bit line TRKBL[3] pair is selected by the multiplexers 143-2 and 145-2. In one embodiment, the tracking word lines TRKWL[0] to TRKWL[3] and the tracking bit lines TRKBL [0] to TRKBL[3] may be switched for each cycle. For example, the combination could be the tracking word line TRKWL[3] and the tracking bit line TRKBL[0] at the control signal CT equal 0 and the tracking word line TRKWL[0] and the tracking bit line TRKBL[2] at the control signal CT equal 1. It should be noted that the initial value of the control signal CT can be any value based on the actual requirement.

In some embodiments, the control signal is configured as one of n values, and the n values are encoded in n bits. For example, in Cycle 1, the control signals $CT_1$ to $CT_{n-1}$ are all logical "0" and the control signal $CT_0$ is logical "1", and the combination of the tracking word line TRKWL[0] and the tracking bit line TRKBL[0] is selected by the multiplexers 143-2 and 145-2. In Cycle 2, the control signals $CT_0$ and $CT_2$ to $CT_{n-1}$ are all logical "0" and the control signal $CT_1$ is logical "1", and the combination of the tracking word line TRKWL[1] and the tracking bit line TRKBL[1] is selected by the multiplexers 143-2 and 145-2. However, the values of the control signal may be encoded in other manners.

Figure 25:
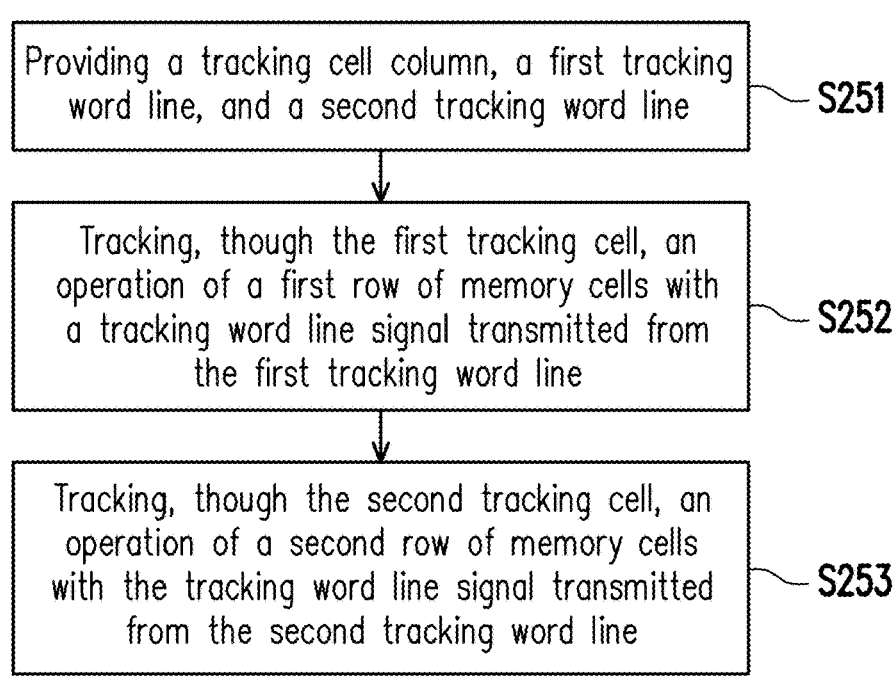
FIG. 25 is a flowchart illustrating a method related to tracking a memory according to one of the exemplary embodiments of the disclosure.

FIG. 25 is a flowchart illustrating a method related to tracking a memory according to one of the exemplary embodiments of the disclosure. Referring to FIG. 25, providing a tracking cell column, a first tracking word line, and a second tracking word line (step S251). The tracking cell column includes a first tracking cell coupled to the first tracking word line and a second tracking cell coupled to the second tracking word line. Taking FIG. 6 as an example, the tracking cell column 17-2 includes the TRK cell $17_0$ coupled to the tracking word line TRKWL[0] and the TRK cell $17_1$ coupled to the tracking word line TRKWL[1].

Tracking, through the first tracking cell, an operation of a first row of memory cells with a tracking word line signal transmitted from the first tracking word line (step S252). Taking FIG. 6 and FIG. 11 as an example, the operation of the row $C_0$ of the memory cell 161 is tracked by the tracking word line signal from the tracking word line TRKWL[0] in Cycle 1 of the clock signal CLK.

Tracking, through the second tracking cell, an operation of a second row of memory cells with the tracking word line signal transmitted from the second tracking word line (step S253). Taking FIG. 6 and FIG. 11 as an example, the operation of the row $C_1$ of the memory cell 161 is tracked by the tracking word line signal from the tracking word line TRKWL[1] in Cycle 2 of the clock signal CLK.

The implementation details of each step in FIG. 25 have been explained in detail in the above embodiments and implementation methods, and will not be repeated.

In one embodiment, tracking, through the first tracking cell, the operation of the first row of memory cells includes: transmitting the tracking word line signal on one of the first tracking word line and the second tracking word line during a first cycle of a clock signal.

In one embodiment, tracking, through the second tracking cell, the operation of the second row of memory cells includes: transmitting the tracking word line signal on another one of the first tracking word line and the second tracking word line during a second cycle of the clock signal.

In one embodiment, one of the first tracking word line and the second tracking word line is selected to transmit the tracking word line signal.

In one embodiment, a clock signal is received. An inter clock signal is generated based on the clock signal. The tracking word line signal is generated based on the inter clock signal.

In one embodiment, one of the first tracking word line and the second tracking word line is selected to transmit the tracking word line signal during a first cycle of the clock signal, and another one of the first tracking word line and the second tracking word line is selected to transmit the tracking word line signal during a second cycle of the clock signal.

In one embodiment, a control signal is generated, where the control signal is configured as one of a first value and a second value. One of the first tracking word line and the second tracking word line is selected to transmit the tracking word line signal in response to the control signal being configured as the first value. Another one of the first tracking word line and the second tracking word line is selected to transmit the tracking word line signal in response to the control signal being configured as the second value.

In one embodiment, a third tracking cell to a n-th tracking cell and a third tracking word line to a n-th tracking word line are further provided. The third tracking word line to the n-th tracking word line respectively coupled to one of the third tracking cell to the n-th tracking cell. An operation of one row of memory cells is tracked through one of the third tracking cell to the n-th tracking cell.

In one embodiment, a first tracking bit line coupled to the first tracking cell and a second tracking bit line coupled to the second tracking cell are further provided. A tracking bit line signal is transmitted on one of the first tracking bit line and the second tracking bit line during a first cycle of a clock signal. The tracking bit line signal is transmitted on another one of the first tracking bit line and the second tracking bit line during a second cycle of the clock signal.

Figure 26:
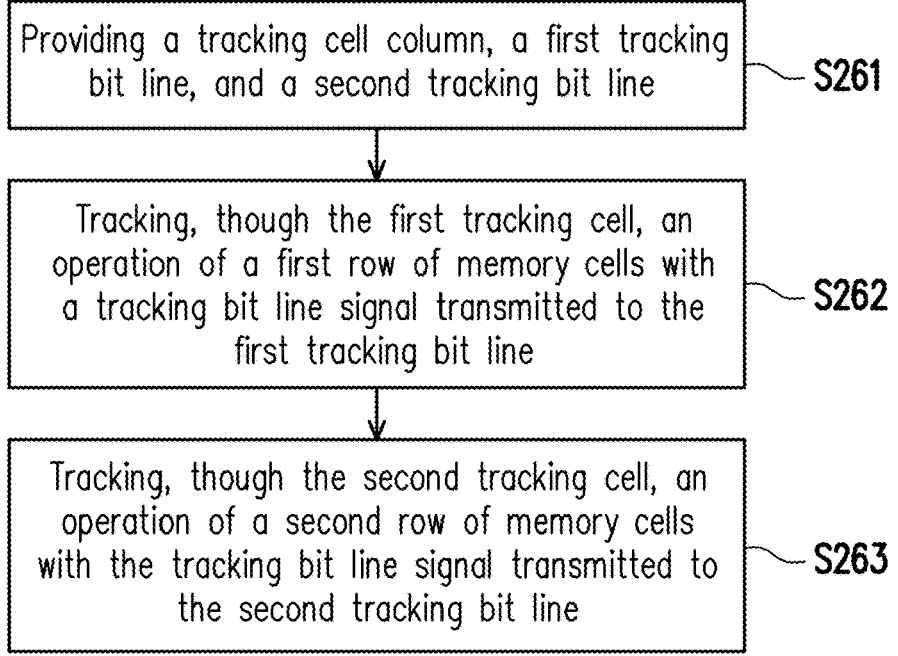
FIG. 26 is a flowchart illustrating a method related to tracking a memory according to one of the exemplary embodiments of the disclosure.

FIG. 26 is a flowchart illustrating a method related to tracking a memory according to one of the exemplary embodiments of the disclosure. Referring to FIG. 26, providing a tracking cell column, a first tracking bit line, and a second tracking bit line (step S261). The tracking cell column includes a first tracking cell coupled to the first tracking bit line and a second tracking cell coupled to the second tracking bit line. Taking FIG. 6 as an example, the tracking cell column 17-2 includes the TRK cell $17_0$ coupled to the tracking bit line TRKBL[0] and the TRK cell $17_1$ coupled to the tracking bit line TRKBL[1].

Tracking, through the first tracking cell, an operation of a first row of memory cells with a tracking bit line signal transmitted to the first tracking bit line (step S262). Taking FIG. 6 and FIG. 11 as an example, the operation of the row $C_0$ of the memory cell 161 is tracked by the tracking bit line signal to the tracking bit line TRKBL[0] in Cycle 1 of the clock signal CLK.

Tracking, through the second tracking cell, an operation of a second row of memory cells with the tracking bit line signal transmitted to the second tracking bit line (step S263). Taking FIG. 6 and FIG. 11 as an example, the operation of the row $C_1$ of the memory cell 161 is tracked by the tracking bit line signal to the tracking bit line TRKBL[1] in Cycle 2 of the clock signal CLK.

The implementation details of each step in FIG. 26 have been explained in detail in the above embodiments and implementation methods, and will not be repeated.

In one embodiment, tracking, through the first tracking cell, the operation of the first row of memory cells includes: transmitting the tracking bit line signal on one of the first tracking bit line and the second tracking bit line during a first cycle of a clock signal.

In one embodiment, tracking, through the second tracking cell, the operation of the second row of memory cells includes: transmitting the tracking bit line signal on another one of the first tracking bit line and the second tracking bit line during a second cycle of the clock signal.

In one embodiment, one of the first tracking bit line and the second tracking bit line is selected to transmit the tracking bit line signal.

In one embodiment, a clock signal is received. An inter clock signal is generated based on the clock signal. The tracking bit line signal is asserted or unasserted based on the inter clock signal.

In one embodiment, one of the first tracking bit line and the second tracking bit line is selected to transmit the tracking bit line signal during a first cycle of the clock signal, and another one of the first tracking bit line and the second tracking bit line is selected to transmit the tracking bit line signal during a second cycle of the clock signal.

In one embodiment, a control signal is generated, where the control signal is configured as one of a first value and a second value. One of the first tracking bit line and the second tracking bit line is selected to transmit the tracking bit line signal in response to the control signal being configured as the first value. Another one of the first tracking bit line and the second tracking bit line is selected to transmit the tracking bit line signal in response to the control signal being configured as the second value.

In one embodiment, a third tracking cell to an n-th tracking cell and a third tracking bit line to an n-th tracking bit line are further provided. The third tracking bit line to the n-th tracking bit line respectively coupled to one of the third tracking cell to the n-th tracking cell. An operation of one row of memory cells is tracked through one of the third tracking cell to the n-th tracking cell.

In one embodiment, a first tracking word line coupled to the first tracking cell and a second tracking word line coupled to the second tracking cell are further provided. A tracking word line signal is transmitted on one of the first tracking word line and the second tracking bit line during a first cycle of a clock signal. The tracking word line signal is transmitted on another one of the first tracking word line and the second tracking word line during a second cycle of the clock signal.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A memory, comprising:
a memory cell array;
a tracking cell column, coupled to the memory cell array and comprising:
a first tracking cell, configured to track an operation of a first row of memory cells of the memory cell array; and
a second tracking cell, configured to track an operation of a second row of memory cells of the memory cell array;
a first tracking word line, coupled to the first tracking cell; and
a second tracking word line, coupled to the second tracking cell,
wherein one of the first tracking word line and the second tracking word line is selected in response to a control signal from a counter circuit.

2. The memory according to claim 1, wherein
a tracking word line signal is transmitted on one of the first tracking word line and the second tracking word line during a first cycle of a clock signal, and
the tracking word line signal is transmitted on another one of the first tracking word line and the second tracking word line during a second cycle of the clock signal.

3. The memory according to claim 1, further comprising:
a master tracking word line, configured to transmit a tracking word line signal; and
a controller, comprising:

a demultiplexer, coupled to the master tracking word line, the first tracking word line, and the second tracking word line, and configured to perform the selection of the first tracking word line and the second tracking word line to transmit the tracking word line signal from the master tracking word line.

4. The memory according to claim 3, wherein the controller further comprises:

a clock generator, coupled to the demultiplexer, and configured to receive a clock signal and generate an inter clock signal based on the clock signal, wherein the inter clock signal is used to generate the tracking word line signal.

5. The memory according to claim 3, wherein the demultiplexer is further configured to:

select one of the first tracking word line and the second tracking word line to transmit the tracking word line signal during a first cycle of the clock signal, and select another one of the first tracking word line and the second tracking word line to transmit the tracking word line signal during a second cycle of the clock signal.

6. The memory according to claim 3, wherein the controller further comprises:

the counter circuit, coupled to the multiplexer, and configured to generate the control signal, wherein the control signal is configured as one of a first value and a second value, and the demultiplexer is further configured to:

select one of the first tracking word line and the second tracking word line to transmit the tracking word line signal in response to receiving the control signal configured as the first value; and select another one of the first tracking word line and the second tracking word line to transmit the tracking word line signal in response to receiving the control signal configured as the second value.

7. The memory according to claim 1, wherein the tracking cell column further comprises:

a third tracking cell to an n-th tracking cell, respectively configured to track an operation of one row of memory cells of the memory cell array, wherein n is an integer larger than two, and the memory further comprises:

a third tracking word line to an n-th tracking word line, respectively coupled to one of the third tracking cell to the n-th tracking cell.

8. The memory according to claim 7, further comprising:

a master tracking word line, configured to transmit a tracking word line signal; and a controller, comprising:

a demultiplexer, coupled to the master tracking word line and the first tracking word line to the n-th tracking word line, and configured to select one of the first tracking word line to the n-th tracking word line to transmit the tracking word line signal from the master tracking word line according to a control signal, wherein the control signal is configured as one of n values, and the n values are encoded in $\log_2$ n bits.

9. The memory according to claim 1, further comprising:

a first tracking bit line, coupled to the first tracking cell; and a second tracking bit line, coupled to the second tracking cell.

10. The memory according to claim 9, wherein a tracking bit line signal is transmitted on one of the first tracking bit line and the second tracking bit line during a first cycle of a clock signal, and the tracking bit line signal is transmitted on another one of the first tracking bit line and the second tracking bit line during a second cycle of the clock signal.

11. A method related to tracking a memory, comprising:

providing a tracking cell column, a first tracking word line, and a second tracking word line, wherein the tracking cell column comprises a first tracking cell coupled to the first tracking word line and a second tracking cell coupled to the second tracking word line;

tracking, through the first tracking cell, an operation of a first row of memory cells with a tracking word line signal transmitted on the first tracking word line; and tracking, through the second tracking cell, an operation of a second row of memory cells with the tracking word line signal transmitted on the second tracking word line, wherein one of the first tracking word line and the second tracking word line is selected in response to a control signal from a counter circuit.

12. The method according to claim 11, wherein tracking, through the first tracking cell, the operation of the first row of memory cells comprises:

transmitting the tracking word line signal on one of the first tracking word line and the second tracking word line during a first cycle of a clock signal, and tracking, through the second tracking cell, the operation of the second row of memory cells comprises:

transmitting the tracking word line signal on another one of the first tracking word line and the second tracking word line during a second cycle of the clock signal.

13. The method according to claim 11, further comprising:

selecting one of the first tracking word line and the second tracking word line to transmit the tracking word line signal.

14. The method according to claim 13, further comprising:

receive a clock signal;

generate an inter clock signal based on the clock signal; and generate the tracking word line signal based on the inter clock signal.

15. The method according to claim 13, further comprising:

select one of the first tracking word line and the second tracking word line to transmit the tracking word line signal during a first cycle of the clock signal, and select another one of the first tracking word line and the second tracking word line to transmit the tracking word line signal during a second cycle of the clock signal.

16. The method according to claim 13, further comprising:

generating the control signal by the counter circuit, wherein the control signal is configured as one of a first value and a second value;

selecting one of the first tracking word line and the second tracking word line to transmit the tracking word line signal in response to the control signal being configured as the first value; and selecting another one of the first tracking word line and the second tracking word line to transmit the tracking word line signal in response to the control signal being configured as the second value.

17. The method according to claim 11, further comprising:

providing a third tracking cell to an n-th tracking cell and a third tracking word line to an n-th tracking word line, wherein the third tracking word line to the n-th tracking word line respectively coupled to one of the third tracking cell to the n-th tracking cell; and tracking, through one of the third tracking cell to the n-th tracking cell, an operation of one row of memory cells.

18. The method according to claim 11, further comprising:

providing a first tracking bit line coupled to the first tracking cell and a second tracking bit line coupled to the second tracking cell;

transmitting a tracking bit line signal on one of the first tracking bit line and the second tracking bit line during a first cycle of a clock signal, and transmitting the tracking bit line signal on another one of the first tracking bit line and the second tracking bit line during a second cycle of the clock signal.

19. A memory, comprising:

a memory cell array;

a tracking cell column, coupled to the memory cell array and comprising:

a first tracking cell, configured to track an operation of a first row of memory cells of the memory cell array; and a second tracking cell, configured to track an operation of a second row of memory cells of the memory cell array;

a first tracking bit line, coupled to the first tracking cell; and a second tracking bit line, coupled to the second tracking cell wherein one of the first tracking bit line and the second tracking bit line is selected in response to a control signal from a counter circuit.

20. The memory according to claim 19, wherein a tracking bit line signal is transmitted to a master tracking bit line from one of the first tracking bit line and the second tracking bit line during a first cycle of a clock signal, and the tracking bit line signal is transmitted to a master tracking bit line from another one of the first tracking bit line and the second tracking bit line during a second cycle of the clock signal.

* * * * *